(12) United States Patent
Kunikiyo

(10) Patent No.: US 6,316,799 B1
(45) Date of Patent: Nov. 13, 2001

(54) MEMORY CELL, METHOD OF CONTROLLING SAME AND METHOD OF MANUFACTURING SAME

(75) Inventor: Tatsuya Kunikiyo, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/436,764

(22) Filed: Nov. 9, 1999

(30) Foreign Application Priority Data

Jun. 8, 1999 (JP) .................................................. 11-161077

(51) Int. Cl.$^7$ ........................... H01L 27/108; H01L 29/76
(52) U.S. Cl. ........................... 257/296; 257/302; 257/303; 257/306; 257/327
(58) Field of Search ........................... 257/296, 300–303, 257/306, 307–310, 327–334, 905–908; 438/238, 239, 242, 268, 270, 271, 212, 386, 399

(56) References Cited

U.S. PATENT DOCUMENTS

| | | | |
|---|---|---|---|
| 5,281,837 | * 1/1994 | Kohyama | 257/296 |
| 5,470,776 | * 11/1995 | Ryou | 438/152 |
| 5,578,850 | * 11/1996 | Fitch et al. | 257/329 |

FOREIGN PATENT DOCUMENTS 4-242973 * 8/1992 (JP).
9-298278   11/1997 (JP).

OTHER PUBLICATIONS

Hyun–Jin Cho, et al. "A Novel Pillar DRAM Cell For 4Gbit and Beyond", Symposium on VLSI Technology Digest of Technical Papers, 1998, pp. 38–39.

Yoon–soo Chun, et al. "A New DRAM Cell Technology Using Merged Process with Storage Node and Memory Cell Contact for 4Gb DRAM and Beyond", IEDM Technology Digest, 1998, pp. 351–354.

* cited by examiner

Primary Examiner—Steven Loke
Assistant Examiner—Hong Kim Vu
(74) Attorney, Agent, or Firm—Oblon, Spivak, McClelland, Maier & Neustadt, P.C.

(57) ABSTRACT

A DRAM memory cell includes a cell transistor (91a) having a source/drain region (6a) connected to a lower electrode (15) of a capacitor (18a) through a pad (10a) and a storage node (11a). During a pause, the lower electrode (15) is not depleted, but at least one of the pad (10a) and the storage node (11a) is depleted to increase a voltage drop therein. The voltage drop alleviates an electric field at a gate end of the transistor (91a) to reduced a TAT (Trap Assisted Tunneling) induced leakage current. The DRAM memory cell is provided which decreases a leakage current from the capacitor and increases time intervals between refresh operations, or refresh pause time.

5 Claims, 34 Drawing Sheets

F I G . 1 1
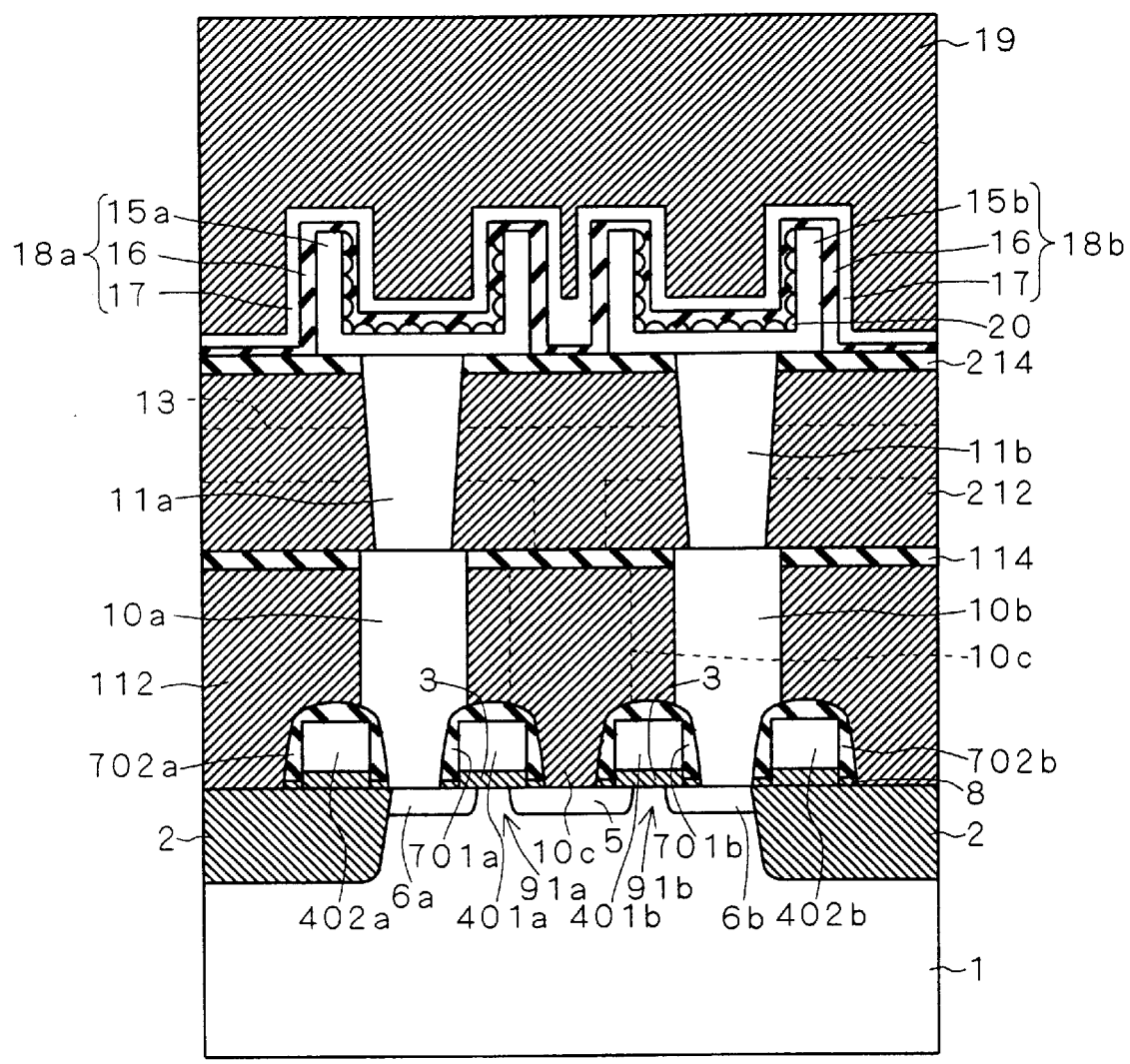

MEMORY CELL, METHOD OF CONTROLLING SAME AND METHOD OF MANUFACTURING SAME

BACKGROUND OF THE INVENTION

1. Field of the Invention

The present invention relates to a memory cell of a DRAM (Dynamic Random Access Memory) and, more particularly, to a memory cell having a structure in which a capacitor and a transistor connected thereto are stacked on a semiconductor substrate.

2. Description of the Background Art

A DRAM comprises a memory cell array serving as a storage area for storing a large amount of information, and a peripheral circuit part for causing the memory cell array to perform a predetermined input/output operation. The memory cell array has a plurality of memory cells arranged in an array and each corresponding to a minimum storage unit. A memory cell basically comprises a capacitor and a MOS (Metal Oxide Semiconductor) transistor (cell transistor) connected to the capacitor. Data values "0" and "1" (or vice versa) are associated with whether or not the capacitor stores a predetermined electric charge, and are provided for processing of the stored information.

FIG. 50 is a circuit diagram of an equivalent circuit of a typical DRAM memory cell 200A. The memory cell 200A comprises a capacitor 201 and a cell transistor 202. The capacitor 201 has a first end receiving a fixed potential, e.g. a ground potential, and a second end connected to a bit line 203 through the cell transistor 202. The cell transistor 202 has a gate electrode connected to a word line 204. A sense amplifier 205 connected to the bit line 203 is also shown in FIG. 50. The cell transistor 202 further has a pair of electrodes for establishing a connection between the bit line 203 and the capacitor 201. The pair of electrodes of the cell transistor 202 function as a source of carriers or function to drain carriers out of the cell transistor 202, and therefore are referred to hereinafter as source/drain.

In the memory cell 200A, a leakage current flows between a semiconductor substrate in which the transistor 202 is formed and the capacitor 201. The leakage current varies the electric charge on the capacitor 201 to give rise to an error of the information stored in the capacitor 201. To compensate for such variations in electric charge, the DRAM memory cells perform a refresh operation.

In the refresh operation, the sense amplifier 205 reads information from the capacitor 201, and a write operation is conducted. If it is judged that the capacitor 201 is charged, the sense amplifier 205 replenishes the capacitor 201 with a new electric charge. If it is judged that the capacitor 201 is not charged, the sense amplifier 205 eliminates the electric charge on the capacitor 201.

However, the refresh operation increases the power consumption of a chip with the increase in the number of memory cells. Furthermore, a large leakage current from the capacitor requires the refresh operation to be performed frequently. For example, conventional DRAMs must perform the refresh operation upon the information stored in all memory cells in a relatively short cycle of the order of one millisecond to hundreds of milliseconds.

While the refresh operation is being performed, the memory cells cannot read out the information stored therein. In view of this fact, the frequent refresh operation decreases the efficiency with which the information stored in the memory is used relative to the operating time.

SUMMARY OF THE INVENTION

According to a first aspect of the present invention, a memory cell comprises: a cell transistor having a pair of source/drain regions and a gate electrode; a first semiconductor layer provided on one of the source/drain regions and having a first impurity concentration ranging from about $5 \times 10^{17}/cm^3$ to about $1 \times 10^{20}/cm^3$; a second semiconductor layer provided on the first semiconductor layer and having a second impurity concentration of not less than about $4 \times 10^{20}/cm^3$; a dielectric layer provided on the second semiconductor layer; and an electrode, in conjunction with the dielectric layer and the second semiconductor layer, constituting a capacitor, the second semiconductor layer serving as a counter electrode to the electrode.

Preferably, according to a second aspect of the present invention, the memory cell of the first aspect further comprises an interlayer insulation film for providing isolation between the capacitor and the cell transistor, wherein the first semiconductor layer includes a storage node extending through the interlayer insulation film, and a pad between the storage node and the one of the source/drain regions.

Preferably, according to a third aspect of the present invention, in the memory cell of the first or second aspect, the first semiconductor layer is depleted during a pause period over which the capacitor holds electric charge without being refreshed.

According to a fourth aspect of the present invention, a memory cell comprises: a cell transistor having a pair of source/drain regions and a gate electrode; a conductor provided on one of the source/drain regions and having a cavity therein; and a capacitor formed on the conductor.

According to a fifth aspect of the present invention, a memory cell comprises: a cell transistor having a pair of source/drain regions and a gate electrode; a first interlayer insulation film formed on the cell transistor; a first conductor extending through the first interlayer insulation film and provided on one of the source/drain regions; a second interlayer insulation film isolated from the cell transistor by the first interlayer insulation film; a second conductor extending through the second interlayer insulation film and formed on the first conductor; and a capacitor connected to the first conductor through the second conductor.

According to a sixth aspect of the present invention, a memory cell comprises: a first transistor having a pair of source/drain regions provided in an upper surface of a semiconductor substrate, and a gate electrode opposed to the semiconductor substrate with a first insulation film therebetween; a capacitor opposed to the first transistor with an interlayer insulation film therebetween in a depth direction of the semiconductor substrate, the capacitor being connected to one of the source/drain regions of the first transistor; and a second transistor disposed in the interlayer insulation film between the one of the source/drain regions of the first transistor and the capacitor, the second transistor having a pair of source/drain regions stacked in the depth direction of the semiconductor substrate.

Preferably, according to a seventh aspect of the present invention, in the memory cell of the sixth aspect, the first transistor and the second transistor are of the same conductivity type. The gate electrode of the first transistor has a sidewall covered with a second insulation film, and the pair of source/drain regions of the second transistor are disposed adjacent to the gate electrode of the first transistor with the second insulation film therebetween.

Preferably, according to an eighth aspect of the present invention, in the memory cell of the sixth aspect, the second transistor further has a gate electrode provided over the first transistor, and a second insulation film for covering a sidewall of the gate electrode of the second transistor. The pair of source/drain regions of the second transistor are disposed adjacent to the gate electrode of the second transistor with the second insulation film therebetween.

According to a ninth aspect of the present invention, a method of controlling a memory cell as defined in the eighth aspect comprises the step of bringing the second transistor into conduction before bringing the first transistor into conduction.

Preferably, according to a tenth aspect of the present invention, the memory cell of the sixth aspect further comprises a semiconductor layer for establishing a connection between one of the source/drain regions of the second transistor and the capacitor, wherein the second transistor further has a second insulation film disposed adjacent to the pair of source/drain regions of the second transistor, and wherein a surface of the semiconductor layer in contact with the second insulation film is doped with at least one of nitrogen and hydrogen.

Preferably, according to an eleventh aspect of the present invention, in the memory cell of the seventh or tenth aspect, a surface of the second insulation film in contact with the pair of source/drain regions of the second transistor is doped with oxygen.

According to a twelfth aspect of the present invention, a method of manufacturing a memory cell comprises the steps of: (a) forming a cell transistor having a pair of source/drain regions in an upper surface of a semiconductor substrate; (b) forming an interlayer insulation film having a trench exposing one of the source/drain regions; (c) forming a semiconductor oxide film on an inner wall of the trench; (d) forming a filling element for filling the trench with the semiconductor oxide film; and (e) forming a capacitor connected to the one of the source/drain regions through the filling element.

Preferably, according to a thirteenth aspect of the present invention, in the method of the twelfth aspect, the step (c) comprises the steps of: (c-1) forming a semiconductor film on the inner wall of the trench; (c-2) oxidizing the semiconductor film to provide the semiconductor oxide film; and (c-3) selectively removing the semiconductor oxide film to expose the one of the source/drain regions, with the semiconductor oxide film left on the inner wall of the trench.

Preferably, according to a fourteenth aspect of the present invention, in the method of the thirteenth aspect, the step (d) comprises the steps of: (d-1) stacking a plurality of semiconductor layers constituting a vertical type transistor on the one of the source/drain regions; and (d-2) forming a connecting element for establishing a connection between the vertical type transistor and the capacitor, the connecting element and the vertical type transistor constituting the filling element.

Preferably, according to a fifteenth aspect of the present invention, in the method of the fourteenth aspect, the step (d-2) comprises the steps of: (d-2-1) filling the trench over the vertical type transistor with a semiconductor material; and (d-2-2) doping the semiconductor material with at least one of nitrogen and hydrogen to provide the connecting element.

According to a sixteenth aspect of the present invention, a method of manufacturing a memory cell comprises the steps of: (a) forming a first transistor having a pair of source/drain regions in an upper surface of a semiconductor substrate, and a gate electrode opposed to the semiconductor substrate; (b) forming an insulation film for covering a sidewall of the gate electrode; (c) forming a second transistor having a pair of source/drain regions on one of the source/drain regions of the first transistor, the pair of source/drain regions of the second transistor being in contact with the insulation film and stacked in a depth direction of the semiconductor substrate; and (d) forming a capacitor connected to the one of the source/drain regions of the first transistor through the second transistor.

Preferably, according to a seventeenth aspect of the present invention, in the method of the sixteenth aspect, the step (c) comprises the steps of: (c-1) forming a semiconductor layer on the one of the source/drain regions of the first transistor, the second layer being in contact with the insulation film; and (c-2) implanting ions into the semiconductor layer to form a channel region sandwiched between the pair of source/drain regions of the second transistor.

Preferably, according to an eighteenth aspect of the present invention, in the method of the sixteenth aspect, the step (c) comprises the step of (c-1) forming the pair of source/drain regions of the second transistor and a channel region sandwiched therebetween on the one of the source/drain regions of the first transistor by a CVD process in which switching is done between impurity gases to be introduced.

Preferably, according to a nineteenth aspect of the present invention, in the method of the eighteenth aspect, the first transistor includes a pair of first transistors disposed adjacent to each other. The pair of first transistors share the other of the source/drain regions with each other, and the gate electrodes of the pair of first transistors are arranged in side by side relation. The step (c) further comprises the steps of: (c-2) filling a space on the other of the source/drain regions between the gate electrodes of the pair of first transistors with a filler material, the step (c-2) being performed before the step (c-1); and (c-3) removing the filler material, the step (c-3) being performed after the step (c-1).

In the memory cell of the first aspect of the present invention, the second impurity concentration blocks the second semiconductor layer from being depleted, and the first impurity concentration increases the resistance value of the first semiconductor layer. The increase in the resistance value of the first semiconductor layer increases a voltage drop in the semiconductor layer to decreases the voltage between the gate electrode and the source/drain regions. Thus, the memory cell of the first aspect reduces a TAT (Trap Assisted Tunneling) current dependent upon an electric field at a gate end of the cell transistor to suppress a leakage current from the capacitor without impairing the electrode function of the second semiconductor layer. This increases refresh pause time to reduce power consumption and to enhance the efficiency of operation.

In the memory cell of the second aspect of the present invention, the storage node is shaped to extend through the interlayer insulation film. Therefore, if impurities are diffused from the second semiconductor layer having the relatively high second impurity concentration, the memory cell of the second aspect suppresses the impairment of the effects of the first aspect due to the increase in the resistance value of the first semiconductor layer.

The memory cell of the third aspect of the present invention reduces a leakage of electric charge from the first semiconductor layer itself. If the cell transistor of the third aspect includes a pair of cell transistors disposed adjacent to each other, the memory cell of the third aspect can reduce a parasitic capacitance formed by adjacent first semiconductor layers.

In the memory cell of the fourth aspect of the present invention, the cavity increases the resistance value of the conductor to increase a voltage drop in the conductor, thereby decreasing the voltage between the gate electrode and the source/drain regions. Thus, the memory cell of the fourth aspect reduces a TAT current dependent upon an electric field at a gate end of the cell transistor to suppress a leakage current from the capacitor. This increases refresh pause time to reduce power consumption and to enhance the efficiency of operation.

In the memory cell of the fifth aspect of the present invention, the first conductor extending through the first interlayer insulation film has an increased thickness (height) and, accordingly, an increased resistance value, thereby decreasing the voltage between the gate electrode and the source/drain regions. Thus, the memory cell of the fifth aspect reduces a TAT current dependent upon an electric field at a gate end of the cell transistor to suppress a leakage current from the capacitor without impairing the electrode function of the second semiconductor layer. This increases refresh pause time to reduce power consumption and to enhance the efficiency of operation.

In the memory cell of the sixth aspect of the present invention, the second transistor is present between one of the source/drain regions of the first transistor which is the cell transistor and the capacitor. When the first transistor turns off, the second transistor also turns off to suppress the leakage current.

In the memory cell of the seventh aspect of the present invention, the first transistor and the second transistor are of the same conductivity type, and share the gate electrode with each other. When the first transistor which is the cell transistor turns off, the second transistor also turns off to suppress the leakage current.

The memory cell of the eighth aspect of the present invention, in which the second transistor is controlled independently of the first transistor which is the cell transistor, provides increased control flexibility to suppress the leakage current.

In the method of the ninth aspect of the present invention, the conduction of the second transistor causes signal delay time provided by a resistance element between the first and second transistors to start before the conduction of the first transistor. Therefore, the memory cell can rapidly perform read and write operations.

In the memory cell of the tenth aspect of the present invention, the surface of the semiconductor layer is doped with at least one of nitrogen and hydrogen. This terminates the dangling bonds of semiconductor atoms present near the interface between the second insulation film and the semiconductor layer to reduce an interface state density.

The memory cell of the eleventh aspect of the present invention reduces the interface state between the second transistor and the second insulation film to suppress the leakage current.

In the method of the twelfth aspect of the present invention, the semiconductor oxide film is present between the trench and the filling element to suppress the interface state density, reducing the leakage current.

The method of the thirteenth aspect of the present invention can form the semiconductor oxide film which covers the inner wall of the trench while exposing one of the source/drain regions.

The method of the fourteenth aspect of the present invention, in which the vertical type transistor is formed independently of the cell transistor, provides increased control flexibility to suppress the leakage current.

In the method of the fifteenth aspect of the present invention, the semiconductor material is doped with at least one of nitrogen and hydrogen. This terminates the dangling bonds of semiconductor atoms present near the interface between the semiconductor oxide film and the semiconductor material to reduce the interface state density.

The method of the sixteenth to nineteenth aspects of the present invention can manufacture the memory cell of the seventh aspect.

It is therefore an object of the present invention to provide a DRAM memory cell which decreases a leakage current from a capacitor and increases time intervals between refresh operations, or refresh pause time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a cross-sectional view showing a structure of the memory cells according to a fourth preferred embodiment of the present invention;

DESCRIPTION OF THE PREFERRED EMBODIMENTS

A. Memory Cell Configuration to Which Present Invention Is Applied

Prior to the detailed description on preferred embodiments of the present invention, description will be given on a memory cell configuration to which the present invention is applied.

Figure 51:
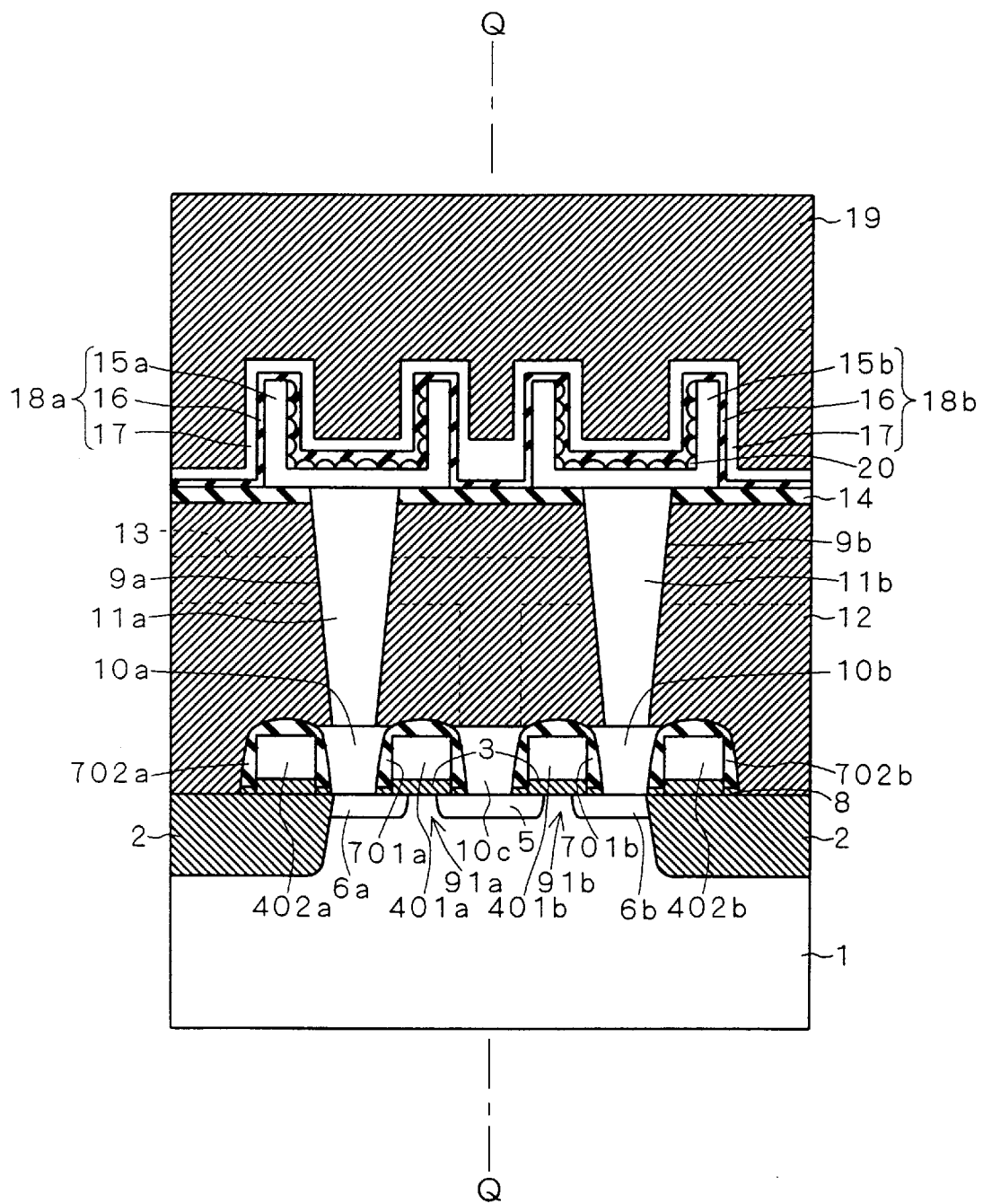
FIG. 51 is a cross-sectional view illustrating a memory cell configuration to which the present invention is applied.

FIG. 51 is a schematic cross-sectional view of a structure of a pair of memory cells. The pair of memory cells shown in FIG. 51 are commonly connected to the same bit line 13. The bit line 13 is located behind the cross-section as viewed from the plane of FIG. 51 and is hence shown by broken lines.

A semiconductor substrate 1 is of p type at least at its surface. At the surface of the semiconductor substrate 1 are formed n type MOS transistors 91a and 91b associated with the pair of memory cells respectively, and an isolating insulation film 2 providing STI (Shallow Trench Isolation) for electrically isolating and insulating the n type MOS transistors 91a and 91b from their surrounding regions.

The MOS transistor 91a has a gate insulation film 3, and a gate electrode 401a formed on the gate insulation film 3 and functioning as a word line 204. Likewise, the MOS transistor 91b has a gate insulation film 3 and a gate electrode 401b. The MOS transistor 91a has a pair of source/drain regions 5 and 6a, and the MOS transistor 91b has a pair of source/drain regions 5 and 6b. The MOS transistors 91a and 91b connected to the same bit line 13 share the source/drain region 5 with each other.

In addition to the gate electrodes 401a and 401b, gate electrodes 402a and 402b serving as word lines of memory cells not shown are provided on the isolating insulation film 2 as shown in FIG. 51. Insulation films 702a, 702b, 701a, 701b cover the gate electrodes 402a, 402b, 401a, 402b including their sidewalls, respectively. An insulation film 8 is provided between the insulation films 701a, 701b, 702a, 702b and the semiconductor substrate 1 (including the source/drain regions 5, 6a, 6b and the isolating insulation film 2).

A pad 10a is provided between the insulation films 702a and 701a, a pad 10b is provided between the insulation films 702b and 701b, and a pad 10c is provided between the insulation films 701a and 701b. The pads 10a, 10b, 10c are in contact with the source/drain regions 6a, 6b, 5, respectively. The pads 10a to 10c are made of polysilicon containing an n type impurity such as phosphorus and arsenic, and are generally doped with phosphorus or arsenic at a concentration of not less than $5 \times 10^{20}/cm^3$ to decrease the resistance thereof.

The semiconductor substrate 1, the insulation films 701a, 701b, 702a, 702b and the pads 10a to 10c are covered with an interlayer insulation film 12 which in turn is covered with a silicon nitride film 14. Trenches 9a, 9b are formed through the interlayer insulation film 12 and the silicon nitride film 14 to reach the pads 10a, 10b, respectively. Storage nodes 11a, 11b are formed in the trenches 9a, 9b in such a manner as to contact the pads 10a, 10b, respectively, and be exposed at the silicon nitride film 14. The bit line 13 is provided in the interlayer insulation film 12 and is connected to the pad 10c, although it does not appear in the plane of the cross section. The storage nodes 11a, 11b are made of polysilicon containing an n type impurity such as phosphorus and arsenic, and are generally doped with phosphorus or arsenic at a concentration of not less than $1 \times 10^{20}/cm^3$ to decrease the resistance thereof.

Recessed lower electrodes 15a and 15b in contact with the storage nodes 11a and 11b, respectively, are provided on the silicon nitride film 14. The lower electrodes 15a, 15b are made of polysilicon, and are generally doped with phosphorus at a concentration of not less than $4 \times 10^{20}/cm^3$ so as not to be depleted. Rugged polysilicon 20 having an uneven surface is formed on the lower electrodes 15a, 15b to increase the surface area.

The silicon nitride film 14 and the lower electrodes 15a, 15b are covered with a capacitor dielectric film 16 which in turn is covered with a cell plate 17. The lower electrode 15a, the capacitor dielectric film 16 and the cell plate 17 form a capacitor 18a, and the lower electrode 15b, the capacitor dielectric film 16 and the cell plate 17 form a capacitor 18b. The cell plate 17 is made of n-doped polysilicon or n-doped amorphous silicon, and serves as an upper electrode of the capacitors 18a, 18b. The capacitors 18a, 18b are covered with an interlayer insulation film 19.

As above described, the pair of memory cells shown in FIG. 51 are disposed in substantially symmetric relation with respect to the vertical line containing the position at which the bit line 13 and the source/drain region 5 are connected, i.e. the phantom line Q—Q of FIG. 51. For simplification, a left-hand structure with respect to the phantom line Q—Q of FIG. 51 will be mainly described. The same description may be applied to a right-hand structure with respect to the phantom line Q—Q of FIG. 51. Reference characters will be sometimes used hereinafter, with their last alphabets a and b dispensed with. Description using a reference character which does not contain the last alphabets a and b shall apply also to reference characters containing the last alphabets a and b if they are present.

The electric charge stored as information on the capacitor 18 is gradually discharged because of a leakage current at an np junction of the source/drain regions 5, 6 and the semiconductor substrate 1 or in the capacitor dielectric film 16. This necessitates a refresh operation for injecting electric charge onto the capacitor 18 at the appropriate times so that the DRAM holds its storage contents.

For example, the potential of the semiconductor substrate 1 is set at −1 V, and the potential of the gate electrode 401 is set at 0 V during a pause. With holes stored on the capacitor 18, the potential of the lower electrode 15 of the capacitor 18 is 2 V and the potential of the bit line 13 is 1 V. However, as the holes stored on the capacitor 18 flow to the semiconductor substrate 1 in the form of a leakage current, the voltage held by the capacitor 18 decreases. In other words, a flow of electron current as a leakage current from the semiconductor substrate 1 to the capacitor 18 decreases the voltage of the capacitor 18 to result in the loss of information.

To avoid the loss of information, the refresh operation is performed which selects the gate electrode 401, increases the potential of the source/drain region 5, and reads and writes the information stored on the capacitor 18. In a write operation, for example, the potential of the gate electrode 401 is raised from a power supply potential of 2 V to 4 V and the potential of the bit line 13 is set at 2 V, with the potential of the semiconductor substrate 1 held at −1 V. In this state, electrons are drawn from the capacitor 18 to the semiconductor substrate 1, thereby causing the potential of the lower electrode 15 to equal the power supply potential of 2 V. In other words, holes are stored on the capacitor 18.

Preferred embodiments to be described below show structures for suppressing the leakage current between the semiconductor substrate 1 and the capacitor 18 so that the refresh operation need not be performed frequently.

B. Increase in Resistance between Capacitor 18 and Source/Drain region 6

Preferred embodiments to be described in Section B are similar in geometric arrangement to the configuration shown in FIG. 51, but are intended to control the resistance between the capacitor 18 and the source/drain region 6 to produce desirable effects.

(b-1) Basic Concept

Figure 1:
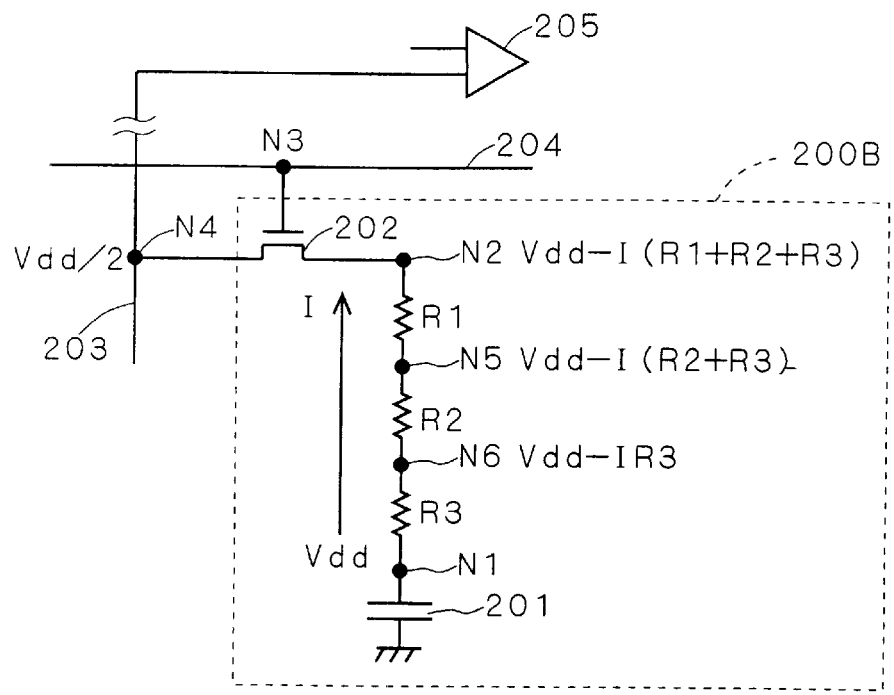
FIG. 1 is a circuit diagram showing a basic concept according to the present invention.
Figure 50:
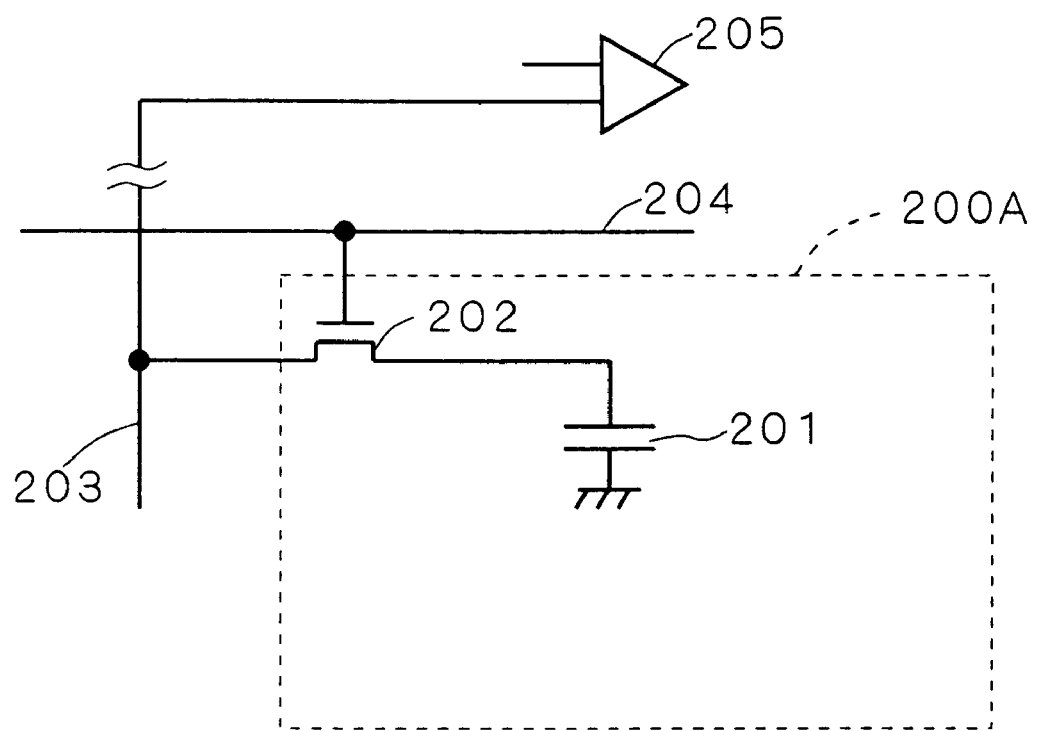
FIG. 50 is a circuit diagram showing an equivalent circuit of a background art memory cell.

FIG. 1 is a circuit diagram of an equivalent circuit of a memory cell 200B according to the present invention. The memory cell 200B differs from the memory cell 200A shown in FIG. 50 in that resistors R1, R2, R3 (having resistance values also designated by the reference characters R1, R2 and R3) are connected in series between the capacitor 201 and the transistor 202. The resistors R1, R2, R3 correspond to resistors in the pad 10, the storage node 11 and the lower electrode 15 shown in FIG. 51, respectively. Connection points N1, N2, N3, N4, N5, and N6 correspond to a connection between the capacitor dielectric film 16 and the lower electrode 15, a connection between the pad 10 and the source/drain region 6, the gate electrode 401, the bit line 13, a connection between the storage node 11 and the pad 10, and a connection between the lower electrode 15 and the storage node 11, respectively.

During a pause, the potential of the gate electrode 401 (the potential at the connection point N3) is set at 0 V, and the potential of the bit line 13 (the potential at the connection point N4) is set at Vdd/2 where Vdd is the voltage held by the capacitor 18 (the voltage at the connection point N1 relative to the ground potential). A flow of leakage current I (having a magnitude also designated by the reference character I) changes the potentials at the connection points N2, N5, N6 to Vdd−I(R1+R2+R3), Vdd−I(R2+R3), Vdd−I R3, respectively.

Factors responsible for the leakage current in the transistor 91 (cell transistor 202) include current generated in the SRH (Shockley-Read-Hall) process in a depletion layer in the transistor 91, and current generated by TAT (Trap Assisted Tunneling) through an interface state or a state in the semiconductor substrate. The leakage current resulting from the tunneling current is predominant particularly in a gate end region having a high electric field intensity. Therefore, the potential difference between the connection points N2 and N3 may be decreased to decrease the leakage current I.

It is not desirable to lower the impurity concentration of the lower electrode 15 to prevent the lower electrode 15 from being depleted. Thus, decreasing the value of the resistance value R3 is difficult. In Section B is proposed a memory cell in which at least one of the resistance values R2 and R1 is increased.

(b-2) First Preferred Embodiment

According to a first preferred embodiment of the present invention, the decrease in the potential at the connection point N2 of FIG. 1 is suppressed by increasing the resistance value R1 of the pad 10 while decreasing the resistance value R3 of the lower electrode 15.

Figure 2:
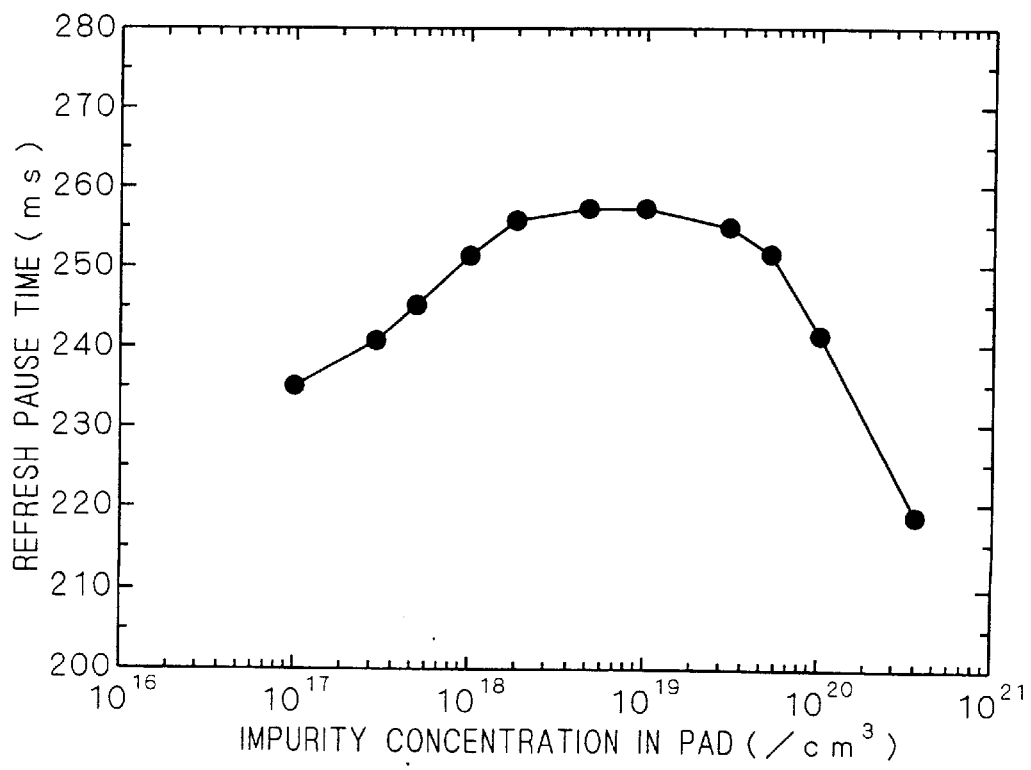
FIG. 2 is a graph showing a simulation result according to a first preferred embodiment of the present invention.

FIG. 2 is a graph showing a simulation result of the relationship between the impurity concentration in the pad 10 and refresh pause time at 120° C. The impurity concentration in the lower electrode 15 is set at not less than $4 \times 10^{20}/cm^3$, for example $8 \times 10^{20}/cm^3$, to prevent the lower electrode 15 from being depleted. Similarly, the phosphorus concentration in the storage node 11 is set at, for example, $4 \times 10^{20}/cm^3$.

The impurity concentration in the pad 10 as low as not greater than $5 \times 10^{17}/cm^3$ does not allow rapid potential transmission during the read operation and the refresh operation of the memory cell to shorten the refresh pause time. On the other hand, the increase in the impurity concentration in the pad 10 decreases the resistance value R1 to increase the leakage current during a pause. At the impurity concentration of not less than $1 \times 10^{20}/cm^3$ in the pad 10, the refresh pause time tends to remarkably decrease. It is therefore preferable that the impurity concentration in the pad 10 ranges from $5 \times 10^{17}$ to $1 \times 10^{20}/cm^3$. More preferably, the impurity concentration in the pad 10 ranges from $1 \times 10^{18}$ to $5 \times 10^{19}/cm^3$ to provide the longest refresh pause time. Depleting the pad 10 during the pause is particularly preferable for reduction in leakage current. For example, the phosphorus concentration in the pad 10 is set at $1 \times 10^{19}/cm^3$.

Thus increasing the resistance R1 provides a higher value R1+R2+R3 than ever before. Additionally, at least part of the pad 10 is depleted, which decreases a parasitic capacitance between the gate electrodes 401 and 402 disposed on opposite sides of the pad 10. This is effective in shortening a signal delay in the gate electrodes 401 and 402 serving as the word lines.

Conversely, the phosphorus concentration in the storage node 11 may be decreased to, for example, $8\times10^{19}$ to $1\times10^{20}/cm^3$ to increase the resistance value R2. In this case, at least part of the storage node 11 is preferably depleted, which increases the resistance value R2 to decrease the leakage current. This is effective in decreasing a parasitic capacitance between the bit line 13 and the storage node 11 to shorten a signal delay in the bit line 13. Of course, both of the resistance values R2 and R1 may be increased.

For instance, Japanese Patent Application Laid-Open No. P09-298278A (1997) discloses a structure in which, as viewed in relation to the structure of FIG. 51, the lower electrode 15 of the capacitor 18 and the inside of the storage node 11 are integrated together and the storage node 11 has a portion of a lower impurity concentration extending adjacent to the interlayer insulation film 12 and having a thickness of about tens of nanometers. In this structure, amorphous silicon having such a lower impurity concentration directly contacts the source/drain region 6, rather than through the pad 10.

However, it is desirable to provide a difference in impurity concentration between the lower electrode 15 and the storage node 11 as described in the first preferred embodiment, rather than a difference in impurity concentration between portions of the storage node 11, since the concentration of the impurity diffused from the lower electrode 15 to the storage node 11 by the CVD (Chemical Vapor Deposition) process and heat treatment (to be described later) after the formation of the lower electrode 15 exerts slight influence upon the resistance values R2 and R1 because of the conventionally sufficient length of the storage node 11.

FIGS. 3 through 8 are cross-sectional views showing a method of manufacturing memory cells in a step-by-step manner according to the first preferred embodiment. The p type semiconductor substrate 1 mainly containing, for example, silicon is prepared. The isolating insulation film 2 made of, for example, silicon oxide is formed in a main surface of the semiconductor substrate 1 to surround an active region electrically isolated from the exterior. A doped well layer, a doped channel cut layer, and a doped channel layer are formed in the main surface of the semiconductor substrate 1. The doped layers are not shown in FIGS. 3 through 8.

The gate insulation film 3 having a thickness on the order of 50 to 80 nm is formed on the entire surface of the resultant structure, and then a film of gate electrode material having a thickness of 200 nm is deposited on the gate insulation film 3. An insulation film 220 having a thickness of 100 nm is deposited on the film of gate electrode material. These films are deposited using CVD equipment. The gate electrode material may be selected from the group consisting of, for example, phosphorus-doped polysilicon, phosphorus-doped amorphous silicon, a two-layered $WSi_x$/phosphorus-doped polysilicon structure (x=2 to 3), and a two-layered $WSi_x$/phosphorus-doped amorphous silicon structure. The gate electrode material also may be metal such as copper and tungsten. Phosphorus doping is accomplished by flowing $PH_3$ gas with $SiH_4$ gas in a reaction chamber of the CVD equipment.

A photoresist is applied to the insulation film 220 and patterned through a transfer step. The insulation film 220 functions to prevent the photoresist from narrowing due to halation during exposure in the transfer step. Using the patterned photoresist as a mask, the gate electrode material and the insulation film 220 are patterned by reactive ion etching to provide the gate electrodes 402a, 401a, 401b, 402b arranged in the order named in a direction perpendicular to the thickness of the semiconductor substrate 1 and functioning as the word lines. The photoresist on the insulation film 220 is removed by overetching during the reactive ion etching process.

Figure 3:
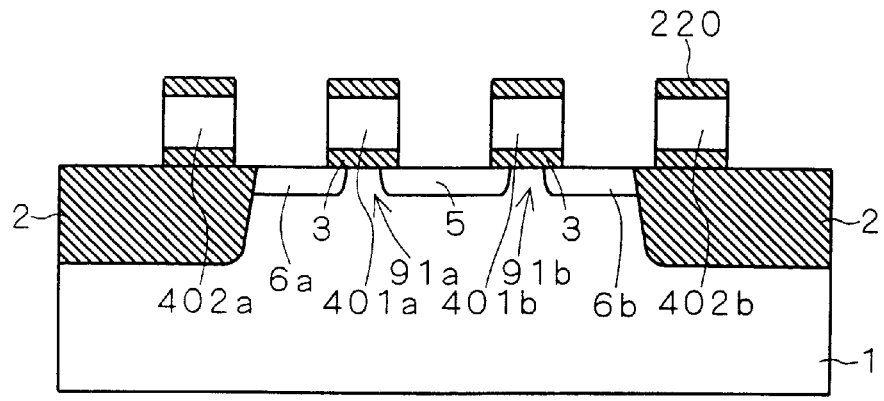
FIGS. 3 through 8 are cross-sectional views showing a method of manufacturing memory cells in a step-by-step manner according to the first preferred embodiment of the present invention.

Using the gate electrodes 401 and 402 as a mask, for example, phosphorus ions are implanted to form the source/drain regions 5 and 6 in a self-aligned fashion, providing the structure shown in FIG. 3. The formation of the source/drain regions 5 and 6 requires only the introduction of an n type impurity into the p type semiconductor substrate 1 and may employ other techniques, e.g., the plasma doping technique and the cluster ion beam technique. The insulation film 220 functions to suppress damages to the gate electrode material during the reactive ion etching process and damages to the gate electrodes 401 and 402 during the ion implantation process.

Next, RTA (Rapid Thermal Annealing) is performed at 900° C. for 30 seconds, e.g., in a nitrogen atmosphere to electrically activate the impurity implanted into the semiconductor substrate 1. In the RTA process, the sidewalls and top surfaces of the gate electrodes 401, 402 are nitrided. Further, RTA is performed at 1000° C. for 20 seconds in a dry oxygen atmosphere, thereby mainly oxidizing the surface of the semiconductor substrate 1. In the second RTA process, the sidewall surfaces of the gate electrodes 401 and 401 which have been already nitrided are hardly oxidized.

Figure 4:
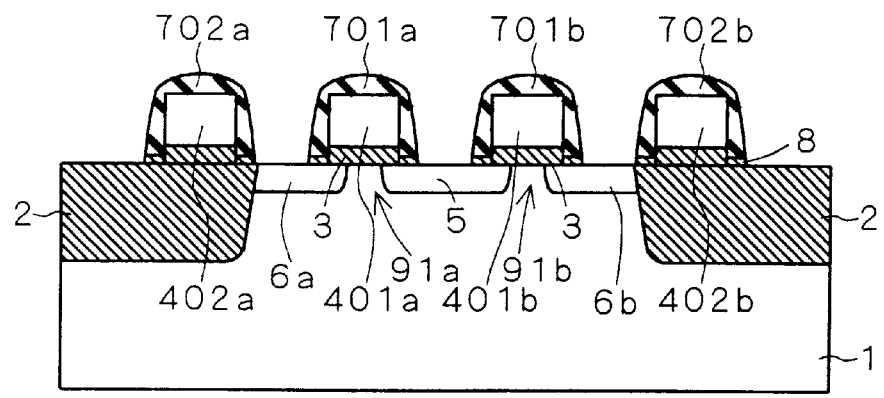

An insulation film of, e.g., silicon nitride is deposited on the entire surface of the resultant structure. Reactive ion etching is performed to remove the silicon nitride film and parts of the oxide film which are formed on the semiconductor substrate 1. This provides the insulation films 702a, 701a, 701b, 702b which cover the gate electrodes 402a, 401a, 401b, 402b, respectively, and the insulation film 8 between the semiconductor substrate 1 and the insulation films 702a, 701a, 701b, 702b, as illustrated in FIG. 4. In the above instance, the insulation films 701, 702 are made of silicon nitride, and the insulation film 8 is made of silicon oxide.

The insulation film 8 is provided between the insulation films 701, 702 and the semiconductor substrate 1 for reasons to be described below. If the insulation films 701, 702 made of silicon nitride directly contact the semiconductor substrate 1 mainly containing p type silicon, the density of states at the interface therebetween increases. The increase in the interface state density decreases the resistance of the transistor 91 to hot carriers, degrading reliability. It is not desirable to use silicon oxide having a low interface state density with silicon for the insulation films 701, 702 for reasons to be described later. It is therefore necessary to provide the insulation film 8 made of a material having a low interface state density with silicon, e.g. silicon oxide, on the semiconductor substrate 1 before the insulation films 701, 702 made of silicon nitride are formed thereon.

Figure 5:
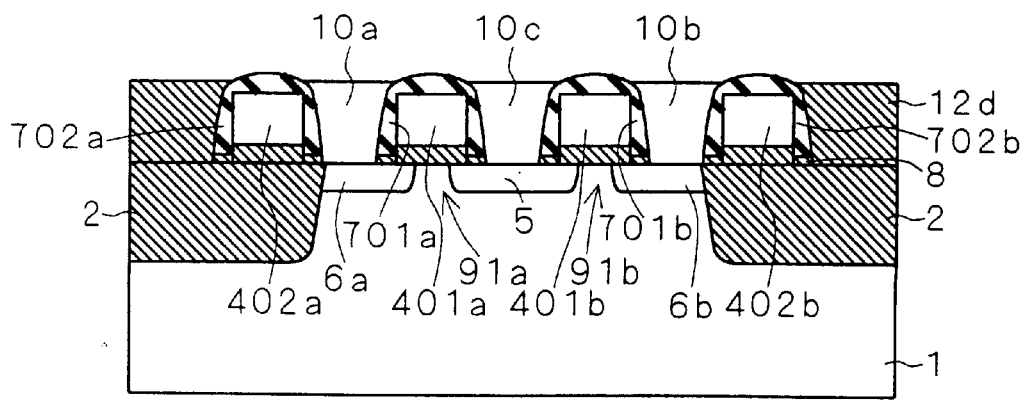

Next, a silicon oxide film, for example, is deposited on the entire surface of the resultant structure, and a photoresist is applied thereto. The photoresist is patterned so that the isolating insulation film 2 is covered therewith. Wet etching using the patterned photoresist as a mask is performed to remove parts of the silicon oxide film which lie on the source/drain regions 5 and 6, exposing the surfaces of the source/drain regions 5 and 6. This leaves a silicon oxide film 12d outside the insulation films 702a, 702b as viewed from the active region, as shown in FIG. 5. The use of silicon oxide for the insulation films 701, 702 is not desirable in order to prevent the insulation films 701, 702 from being impaired during this processing.

Then, phosphorus-doped amorphous silicon is deposited on the top surface of the resultant structure, using the CVD equipment. The concentration of phosphorus for doping is described above. Next, the CMP (Chemical Mechanical Polishing) process is performed using the silicon oxide film 12d and parts of the insulation films 701, 702 which are deposited on top of the gate electrodes 401, 402 as a stopper, to form the pads 10a, 10b, 10c. This provides the structure shown in FIG. 5. The pads 10a, 10b, 10c have a height (thickness) of at least 150 nm.

Heat treatment at about 550 to 660° C. in the reaction chamber of the CVD equipment which is evacuated to a pressure of about $1 \times 10^{-6}$ Torr grows the pads 10a, 10b, 10c in the solid phase with the semiconductor substrate serving as a seed crystal, to increase the crystallinity thereof. During the growth, a crystal grown from a plurality of crystal nuclei present on the surface of the insulation films 701, 702 and a crystal grown from the seed crystal of the semiconductor substrate 1 collide with each other to form a grain boundary once, forming doped polysilicon. Further heat treatment for several hours provides virtually grain-boundary-free doped silicon close to a perfect crystal.

To crystallize amorphous silicon, other techniques may be used, for example, heat treatment for several hours at temperatures ranging from 550 to 700° C. in a nitrogen atmosphere. Alternatively, the CVD conditions may be controlled so that doped polysilicon is formed by selective epitaxial growth without forming amorphous silicon once to provide the pads 10a, 10b, 10c.

Since the pads 10a, 10b, 10c have the low impurity concentration as above described, a contact resistance present at the interface between the semiconductor substrate 1 and the pads 10a, 10b, 10c becomes high. To decrease the contact resistance, phosphorus ions may be implanted into the surface of the semiconductor substrate 1 of the structure shown in FIG. 4 in a self-aligned fashion.

Next, a silicon oxide film 12e, for example, is deposited on the structure shown in FIG. 5. The bit line 13 having a two-layer structure comprising, e.g., tungsten and titanium nitride is formed. A silicon oxide film 12f and the silicon nitride film 14 are deposited. The silicon oxide films 12d, 12e, 12f constitute the interlayer insulation film 12.

A photoresist is applied to the silicon nitride film 14 and patterned through a transfer step. Using the patterned photoresist as a mask, reactive ion etching is performed to form the trench 9 through the silicon nitride film 14 and the interlayer insulation film 12. The etching stops at the top of the pad 10 because of a high etch selectivity ratio between the interlayer insulation film 12 made of silicon oxide and the pad 10 made of silicon.

The photoresist used as the mask is removed, and the trench 9 is filled with doped amorphous silicon, using the CVD equipment. The CMP process is performed using the silicon nitride film 14 as a stopper to planarize the top surface of the doped amorphous silicon, forming the storage node 11. This provides the structure shown in FIG. 6.

To decrease a contact resistance present between the pad 10 and the storage node 11, ions of, e.g., phosphorus may be implanted into the top surface of the pad 10 through the trench 9.

The silicon oxide films 12d, 12e, 12f may be formed using TEOS (tetraethylorthosilicate) or BPTEOS (boro-phospho tetraethylorthosilicate), and may contain fluorine, nitrogen or hydrogen.

Figure 6:
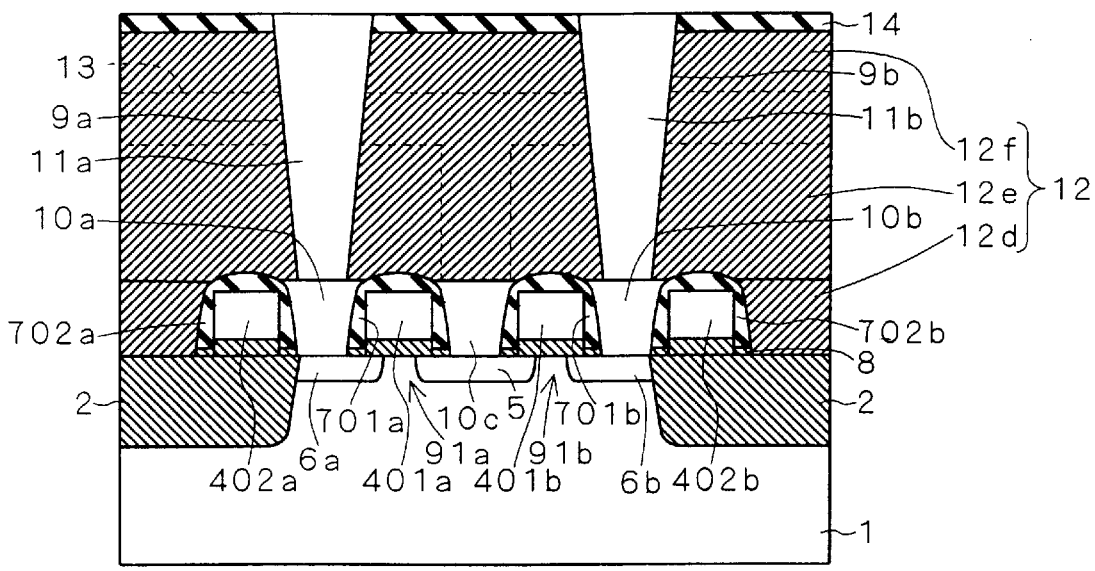
Figure 7:
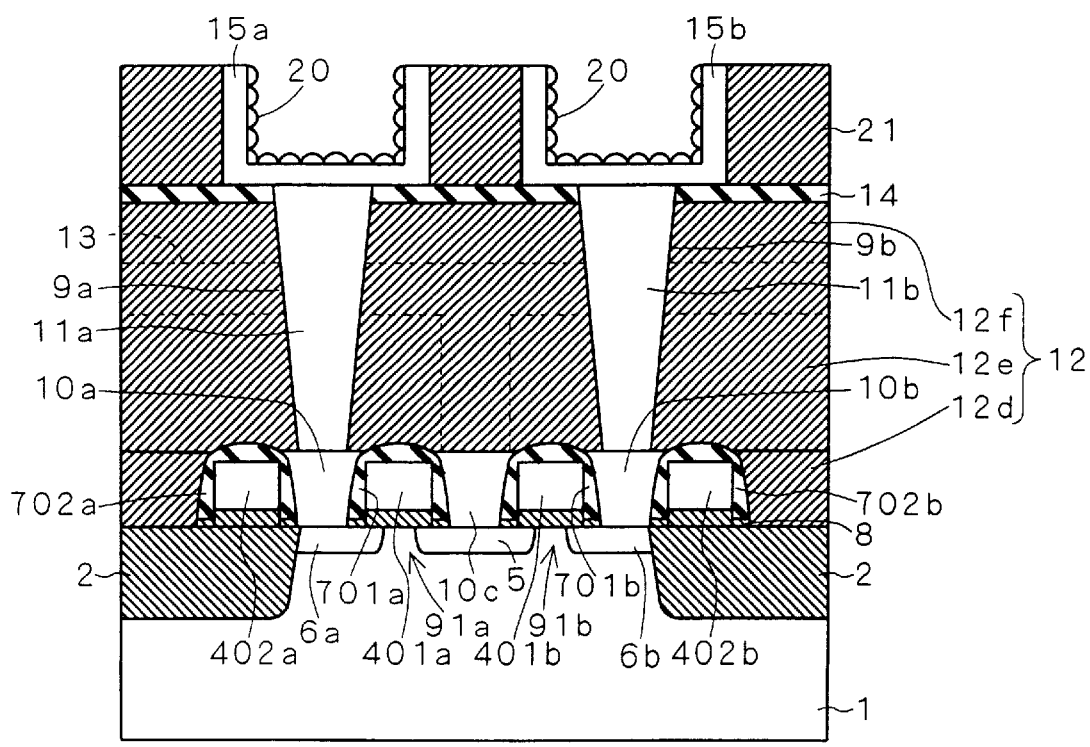
Figure 8:
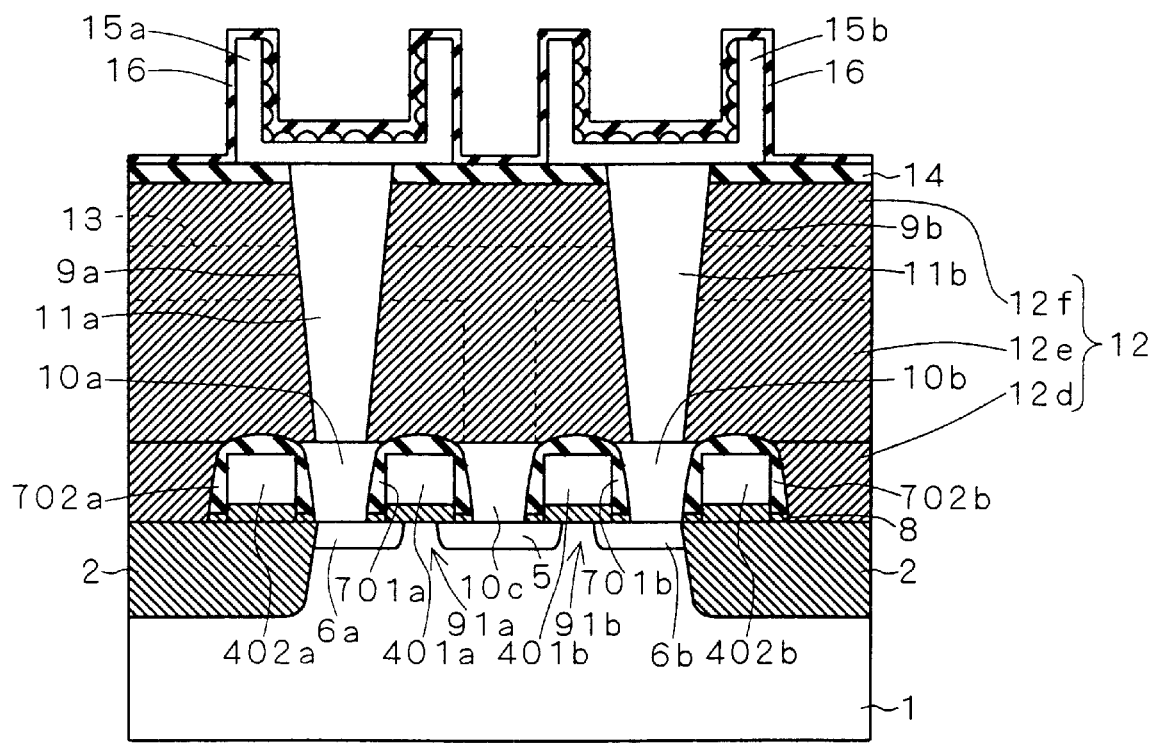

Next, an insulation film 21 formed using, e.g., TEOS is deposited on the structure shown in FIG. 6, and a patterned photoresist is formed thereon. Using the patterned photoresist as a mask, reactive ion etching is performed to remove at least part of the insulation film 21 which overlies the storage node 11, forming a recess over the storage node 11. Thereafter, doped polysilicon is deposited, and the rugged polysilicon 20 is deposited on the surface of the doped polysilicon. The CMP process using the insulation film 21 as a stopper is performed to leave the doped polysilicon only in the recess, forming the lower electrode 15 with the rugged polysilicon 20. This provides the structure shown in FIG. 7. The addition of the rugged polysilicon 20 substantially increases the surface area of the lower electrode 15 to increase the capacitance of the capacitor 18 by a factor of about two.

The rugged polysilicon 20 is formed, for example, in a manner to be described below. Initially, the surface of the lower electrode 15 is subjected to $SiH_4$ gas in the reaction chamber of the CVD equipment held at a temperature of 550 to 570° C. and at a pressure of 0.1 to 0.5 mTorr. This process produces silicon nuclei on the surface of the lower electrode 15. Next, the reaction chamber containing the $SiH_4$ gas is evacuated to a pressure of about $1 \times 10^{-7}$ Torr. Heat treatment for about 30 minutes to one hour with the temperature held at about 550 to 570° C. forms the rugged polysilicon 20 on the surface of the lower electrode 15. The rugged polysilicon 20 is also doped as well as the lower electrode 15.

The insulation film 21 is etched away, and the capacitor dielectric film 16 is then deposited. This provides the structure shown in FIG. 8. The dielectric film may be made of a material selected from the group consisting of silicon nitride, silicon oxynitride, silicon oxide, $Al_2O_3$, a three-layered $TiN/Ta_2O_5/TiN$ structure, and BST ($BaSrTiO_3$).

Thereafter, phosphorus-doped polysilicon or phosphorus-doped amorphous silicon is deposited to form the cell plate 17. This provides the structure shown in FIG. 51.

Heat treatment such as RTA is performed whenever necessary in the abovementioned steps to electrically activate the impurities in the pads 10a, 10b, 10c, the storage node 11 and the lower electrode 15. In particular, heat treatment for activation is essential for the lower electrode 15 since insufficient activation of the impurities in the lower electrode 15 causes the lower electrode 15 to be depleted to result in an insufficient capacitance of the capacitor 18.

(b-3) Second Preferred Embodiment

According to a second preferred embodiment of the present invention, the potential decrease at the connection point N2 of FIG. 1 is suppressed by controlling the geometric shape of the memory cell structure to decrease the resistance value R2 of the storage node 11, rather than controlling the impurity concentration.

Figure 9:
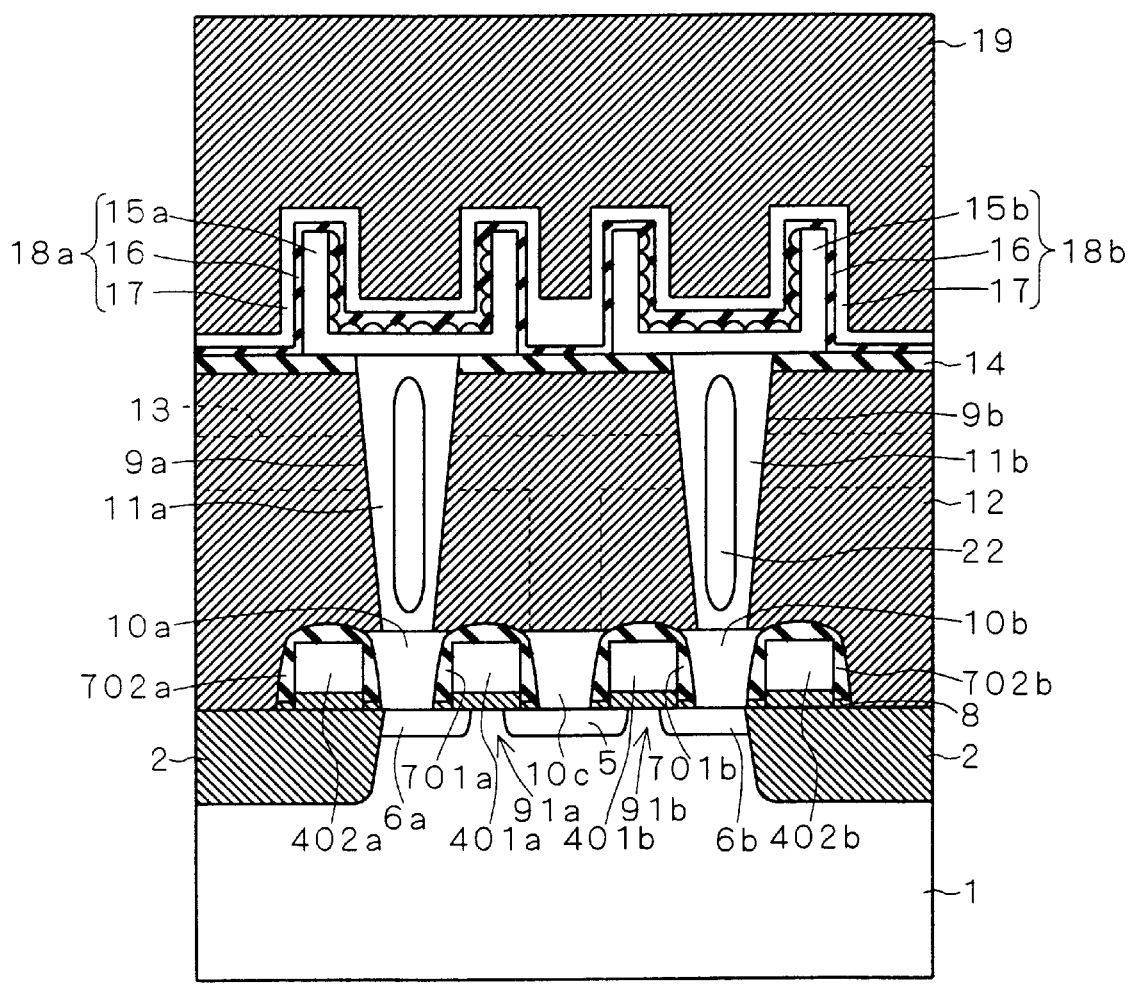
FIG. 9 is a cross-sectional view showing a structure of the memory cells according to a second preferred embodiment of the present invention.

FIG. 9 is a cross-sectional view showing a structure of the memory cells according to the second preferred embodiment. The structure of FIG. 9 characteristically differs from that of FIG. 51 in that a cavity 22 is formed in the storage node 11. The cavity 22 may be formed by adjusting the flow rate of the $SiH_4$ gas in the reaction chamber of the CVD equipment, temperatures, the partial pressure of the gas, deposition time and the like when the trench 9 is filled with phosphorus-doped amorphous silicon. The mechanism of the production of the cavity 22 is such that, in the process of depositing amorphous silicon using the CVD equipment, the opening of the trench 9 is covered with the deposited amorphous silicon before the inside of the trench 9 is filled with the amorphous silicon.

The processing for increasing the crystallinity of the amorphous silicon in the trench 9 may employ the technique described in the first preferred embodiment.

The presence of the cavity 22 which conducts no current in the storage node 11 increases the resistance value R2 of the storage node 11. This increases a voltage drop resulting from the leakage current during the pause to achieve a DRAM cell having long refresh pause time for the reasons described in (b-1).

(b-4) Third Preferred Embodiment

According to a third preferred embodiment of the present invention, the potential decrease at the connection point N2 of FIG. 1 is suppressed by controlling the geometric shape of the memory cell structure to decrease the resistance value R1 of the pad 10, rather than controlling the impurity concentration.

Figure 10:
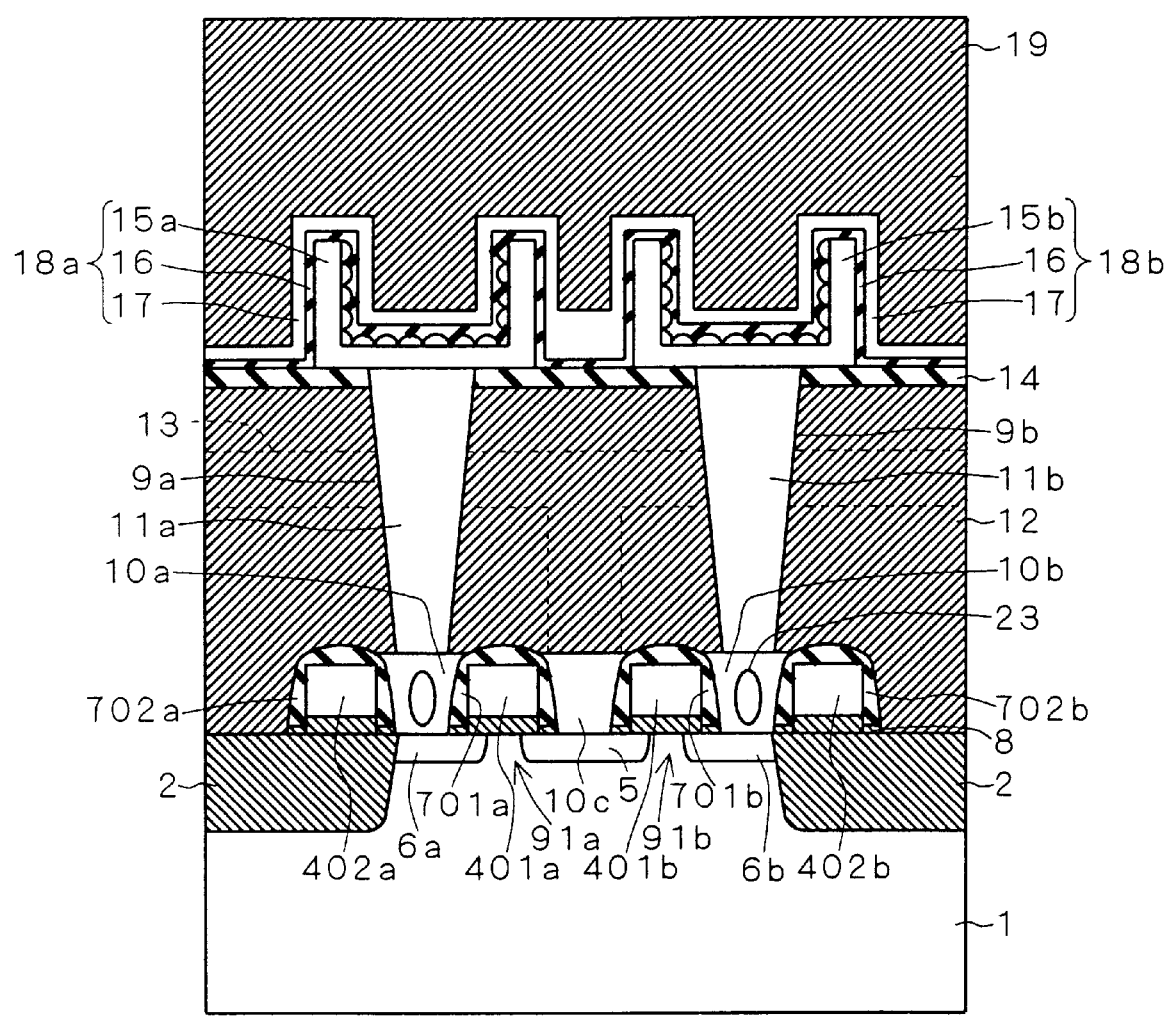
FIG. 10 is a cross-sectional view showing a structure of the memory cells according to a third preferred embodiment of the present invention.

FIG. 10 is a cross-sectional view showing a structure of the memory cells according to the third preferred embodiment. The structure of FIG. 10 characteristically differs from that of FIG. 51 in that cavities 23 are formed in the pads 10a and 10b, respectively. The cavities 23 may be formed by adjusting the CVD conditions when the space between the insulation films 701a and 702a and the space between the insulation films 701b and 702b are filled with phosphorus-doped amorphous silicon. An additional cavity 23 may be formed also in the pad 10c. The mechanism of the production of the cavities 23 is similar to the mechanism of the production of the cavity 22.

The presence of the cavities 23 which conduct no current in the pads 10a and 10b increases the resistance value R1 of the pad 10. Therefore, a DRAM cell having long refresh pause time is achieved, as in the second preferred embodiment.

(b-5) Fourth Preferred Embodiment

According to a fourth preferred embodiment of the present invention, the potential decrease at the connection point N2 of FIG. 1 is suppressed also by controlling the geometric shape of the memory cell structure to decrease the resistance value R1 of the pad 10.

FIG. 11 is a cross-sectional view showing a structure of the memory cells according to the fourth preferred embodiment. The structure of FIG. 11 is similar to that of FIG. 51 in portions including the storage node 11 and farther from the semiconductor substrate 1 than the storage node 11, but characteristically differs from that of FIG. 51 in the structure of the pads 10a, 10b, 10c.

More specifically, the insulation films 701, 702 and the semiconductor substrate 1 are covered with an interlayer insulation film 112 and an insulation film 114 formed thereon. The pad 10a between the insulation films 701a and 702a, the pad 10b between the insulation films 701b and 702b and the pad 10c between the insulation films 701a and 701b extend through the interlayer insulation film 112 and the insulation film 114. An interlayer insulation film 212 and an insulation film 214 formed thereon cover the above-mentioned structure. The storage nodes 11a and 11b in contact with the pads 10a and 10b, respectively, extend through the interlayer insulation film 212 and the insulation film 214. The interlayer insulation films 112, 212 and the insulation films 114, 214 are made of, for example, silicon oxide and silicon nitride, respectively.

The pads 10a and 10b are made higher than the insulation films 701 and 702 to increase the resistance value R1 of the pads 10a and 10b, whereby a DRAM cell having long refresh pause time is achieved, as in the third preferred embodiment.

Figure 12:
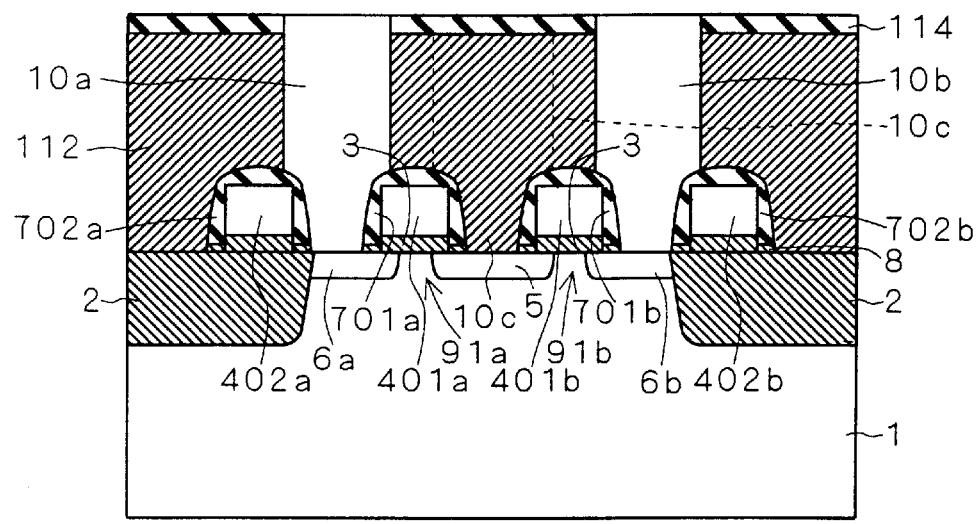
FIGS. 12 and 13 are cross-sectional views showing a method of manufacturing the memory cells in a step-by-step manner according to the fourth preferred embodiment of the present invention.
Figure 13:
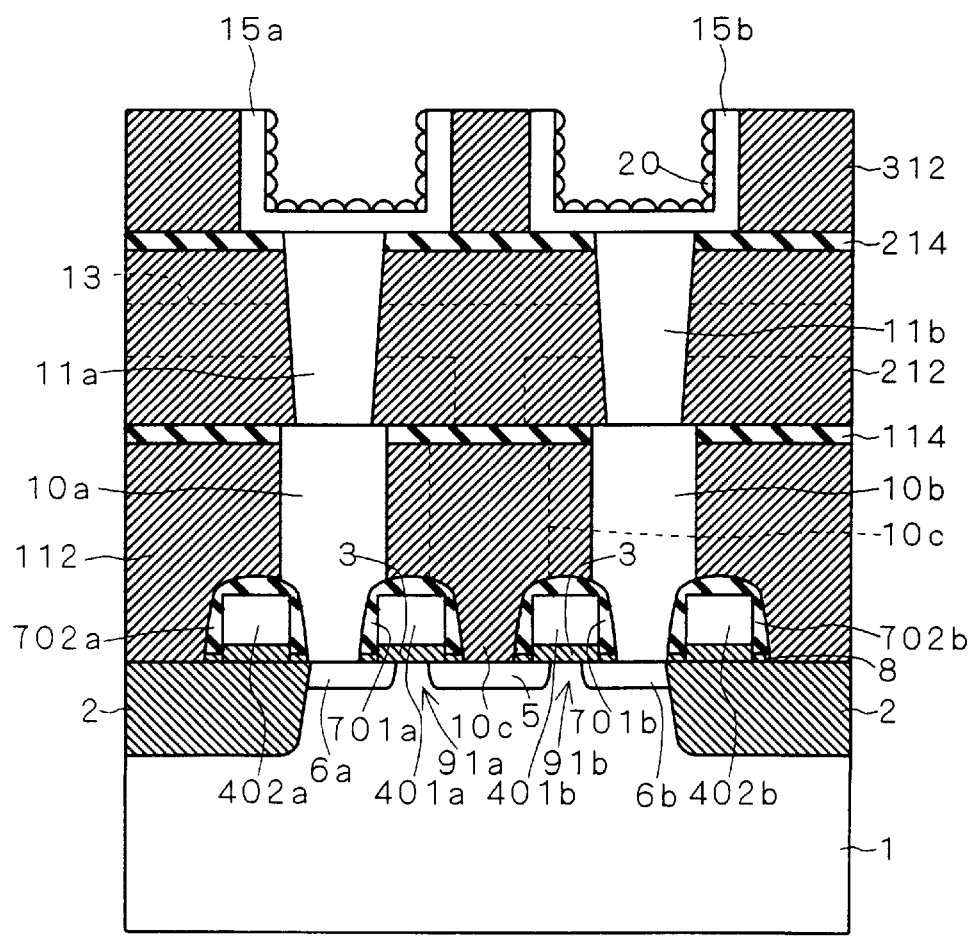

FIGS. 12 and 13 are cross-sectional views showing a method of manufacturing the structure shown in FIG. 11 in a step-by-step manner. After the structure shown in FIG. 4 is produced in the steps described in the first preferred embodiment, a silicon oxide film is formed using, e.g., TEOS on the entire surface of the structure shown in FIG. 4, and a silicon nitride film is deposited on the silicon oxide film. A patterned photoresist is formed on the silicon nitride film. Using the patterned photoresist as a mask, reactive ion etching is performed to form trenches between the insulation films 701a and 702a, between the insulation films 701b and 702b and between the insulation films 701a and 701b, exposing the source/drain regions 5 and 6, with the interlayer insulation film 112 and the insulation film 114 left. The trenches are filled with phosphorus-doped amorphous silicon, and the CMP process using the insulation film 114 as a stopper is performed to form the pads 10a, 10b, 10c (FIG. 12). The pad 10c is shown as not appearing in the plane of the cross section in the fourth preferred embodiment, but may be designed to appear in the plane of the cross section, as in the first to third preferred embodiments.

Thereafter, the interlayer insulation film 212, the insulation film 214, the storage node 11 and the bit line 13 are formed in a manner described in the first preferred embodiment. Then, an insulation film 312 formed using, e.g., TEOS is deposited, and a patterned photoresist is formed on the insulation film 312. Using the patterned photoresist as a mask, reactive ion etching is performed to remove at least part of the insulation film 312 which overlies the storage node 11, forming a recess over the storage node 11. Thereafter, doped polysilicon is deposited, and the rugged polysilicon 20 is deposited on the surface of the doped polysilicon. The CMP process using the insulation film 312 as a stopper is performed to leave the doped polysilicon only in the recess, forming the lower electrode 15 with the rugged polysilicon 20. This provides the structure shown in FIG. 13. Subsequent steps similar to those of the first preferred embodiment are performed to provide the structure shown in FIG. 11.

Figure 14:
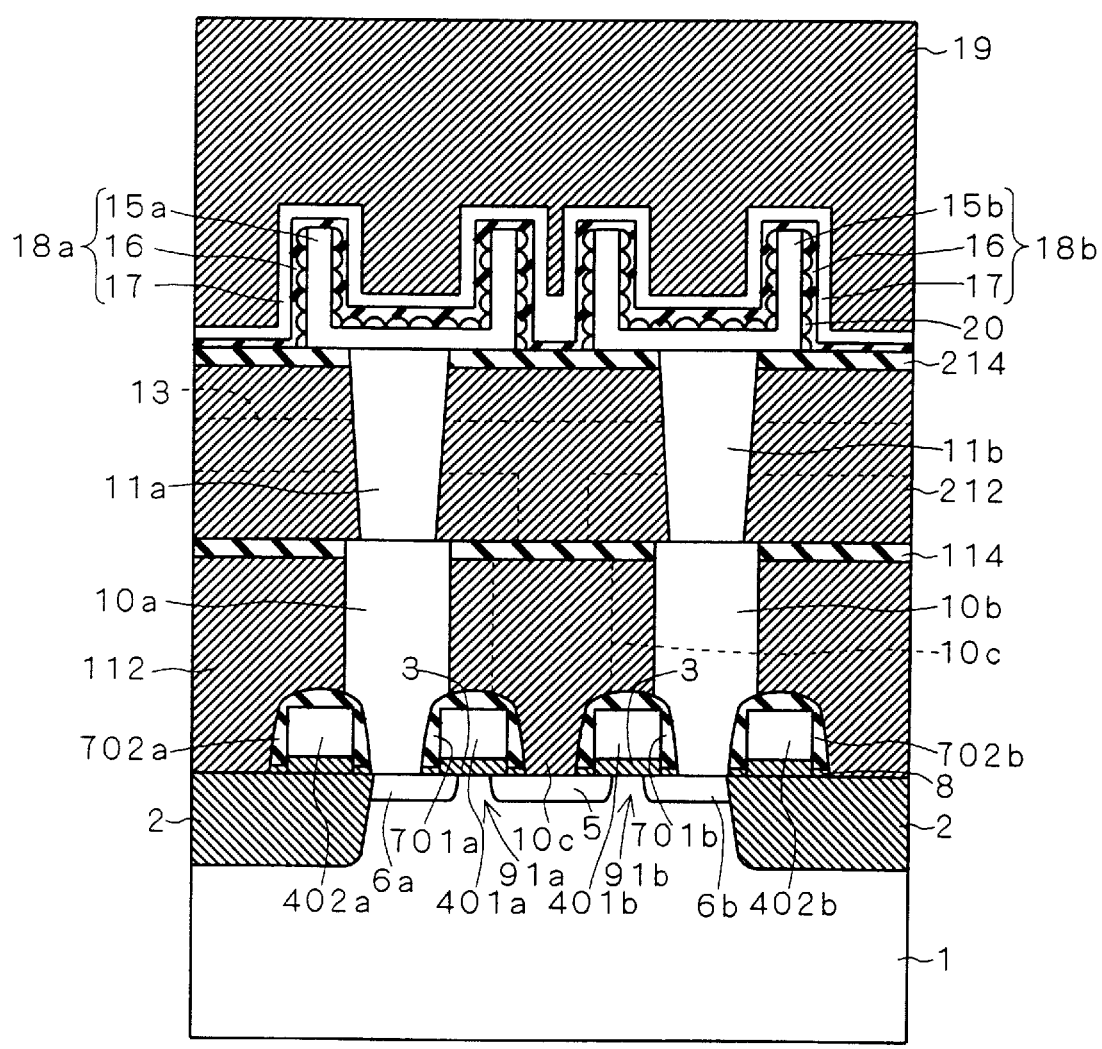
FIG. 14 is a cross-sectional view of a modification of the memory cells according to the fourth preferred embodiment of the present invention.

The rugged polysilicon 20 may be formed not only inside the lower electrode 15 but also outside the lower electrode 15. FIG. 14 is a cross-sectional view showing the structure of FIG. 11 with the rugged polysilicon 20 formed also outside the lower electrode 15. This structure further increases the substantial surface area of the lower electrode 15 to further increase the capacitance value of the capacitor 18.

Figure 15:
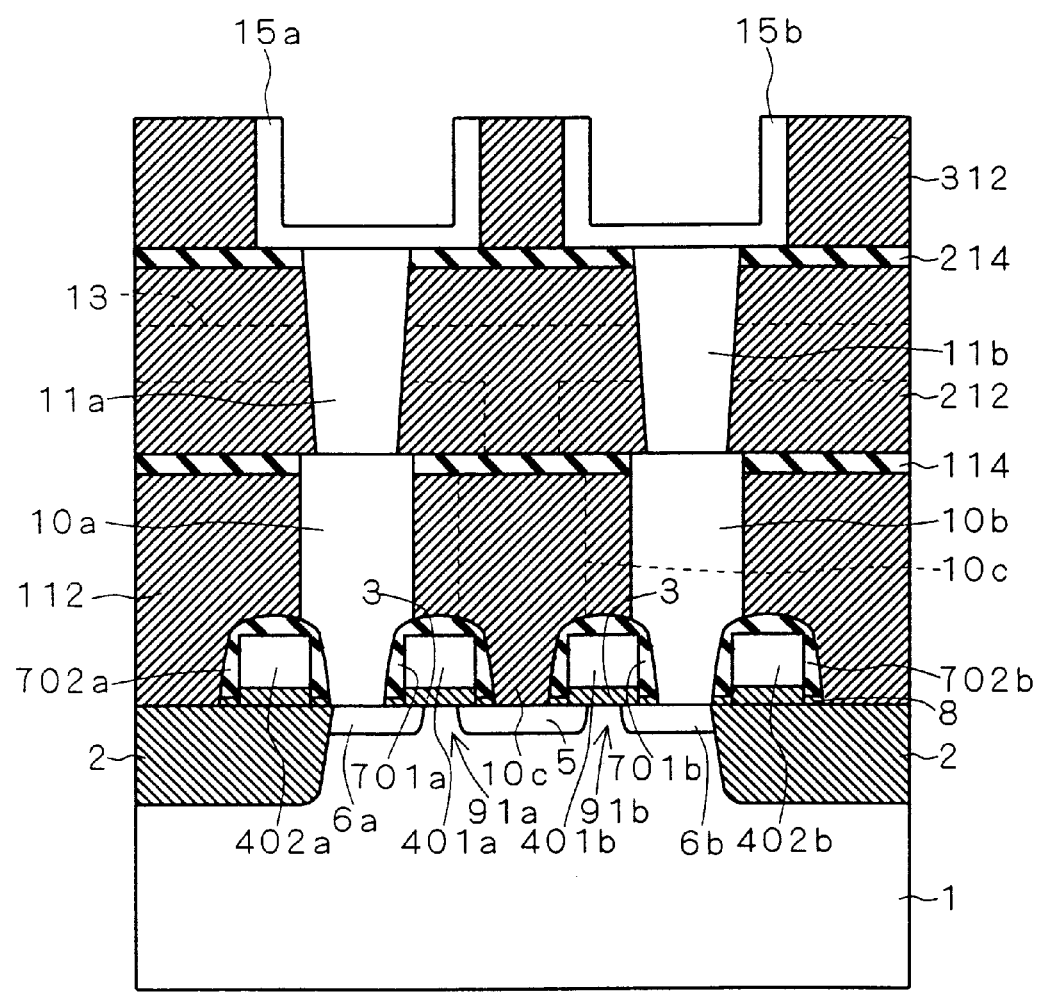
FIGS. 15 through 17 are cross-sectional views showing a method of manufacturing the modification of the memory cells in a step-by-step manner according to the fourth preferred embodiment of the present invention.
Figure 16:
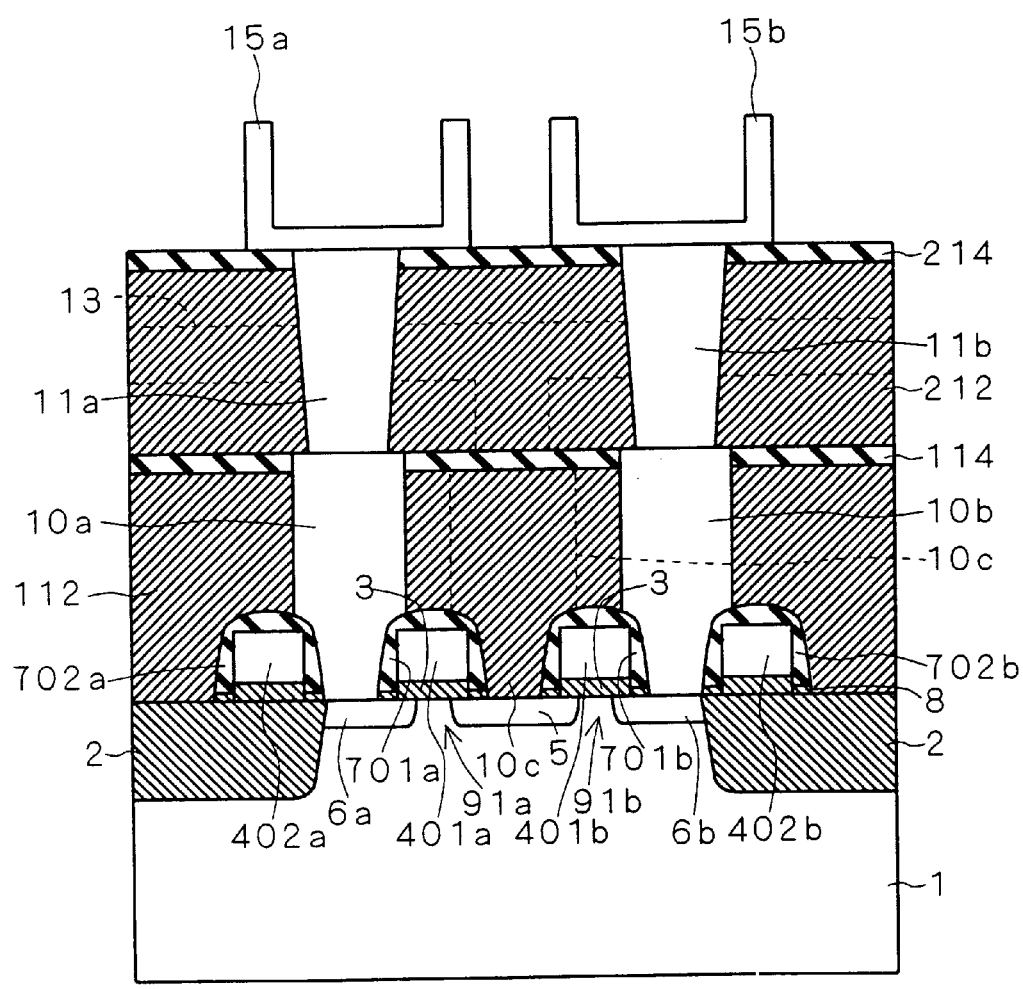
Figure 17:
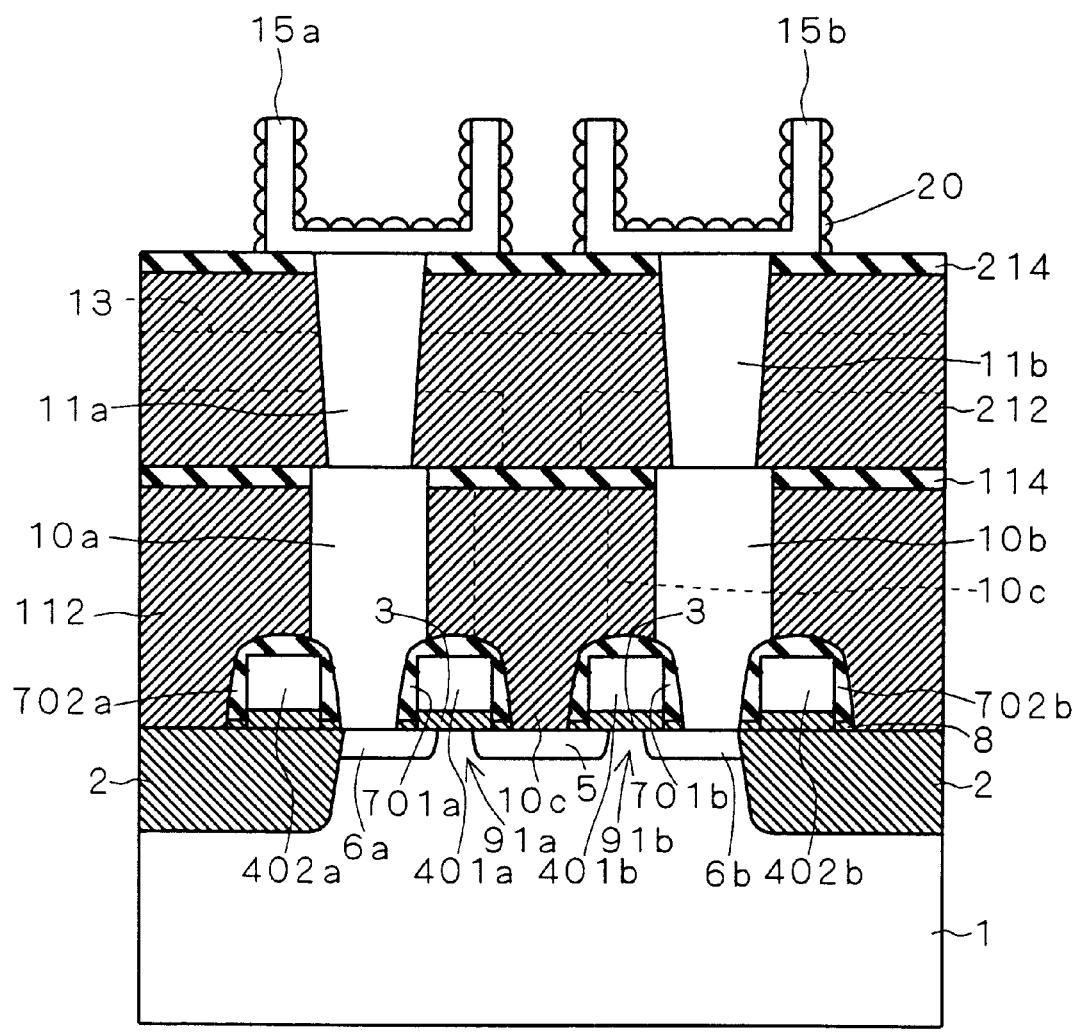

FIGS. 15 through 17 are cross-sectional views showing a method of manufacturing the structure shown in FIG. 14 in a step-by-step manner. After the structure shown in FIG. 6 is produced, the insulation film 312 formed using, e.g., TEOS is deposited, and a patterned photoresist is formed on the insulation film 312. Using the patterned photoresist as a mask, reactive ion etching is performed to remove at least part of the insulation film 312 which overlies the storage node 11, forming a recess over the storage node 11. Thereafter, doped polysilicon is deposited, and the CMP process using the insulation film 312 as a stopper is performed to leave the doped polysilicon only in the recess, forming the lower electrode 15 (FIG. 15).

Then, the insulation film 312 is completely etched away. This provides the structure shown in FIG. 16. The ruggedness forming processing described in the first preferred embodiment is performed to provide the rugged polysilicon 20 on the inner and outer surfaces of the lower electrodes 15, as illustrated in FIG. 17.

The formation of the rugged polysilicon 20 also on the outer surface of the lower electrode 15 may be, of course, applied to the first to third preferred embodiments and also to preferred embodiments to be described in Section C below.

(b-6) Modification

In the above-mentioned preferred embodiments, the resistances of the pad 10 and the storage node 11 are increased. However, the effects of the above-mentioned preferred embodiments may be also produced by intentionally increasing contact resistances between the pad 10 and the source/drain region 6, between the pad 10 and the storage node 11, and between the storage node 11 and the lower electrode 15.

C. Insertion of New Transistor between Capacitor 18 and Source/Drain region 6

Preferred embodiments to be described in Section C show that transistors are provided in place of the pads 10a and 10b and are turned off during the pause, thereby suppressing the leakage current.

(c-1) Fifth Preferred Embodiment

Figure 18:
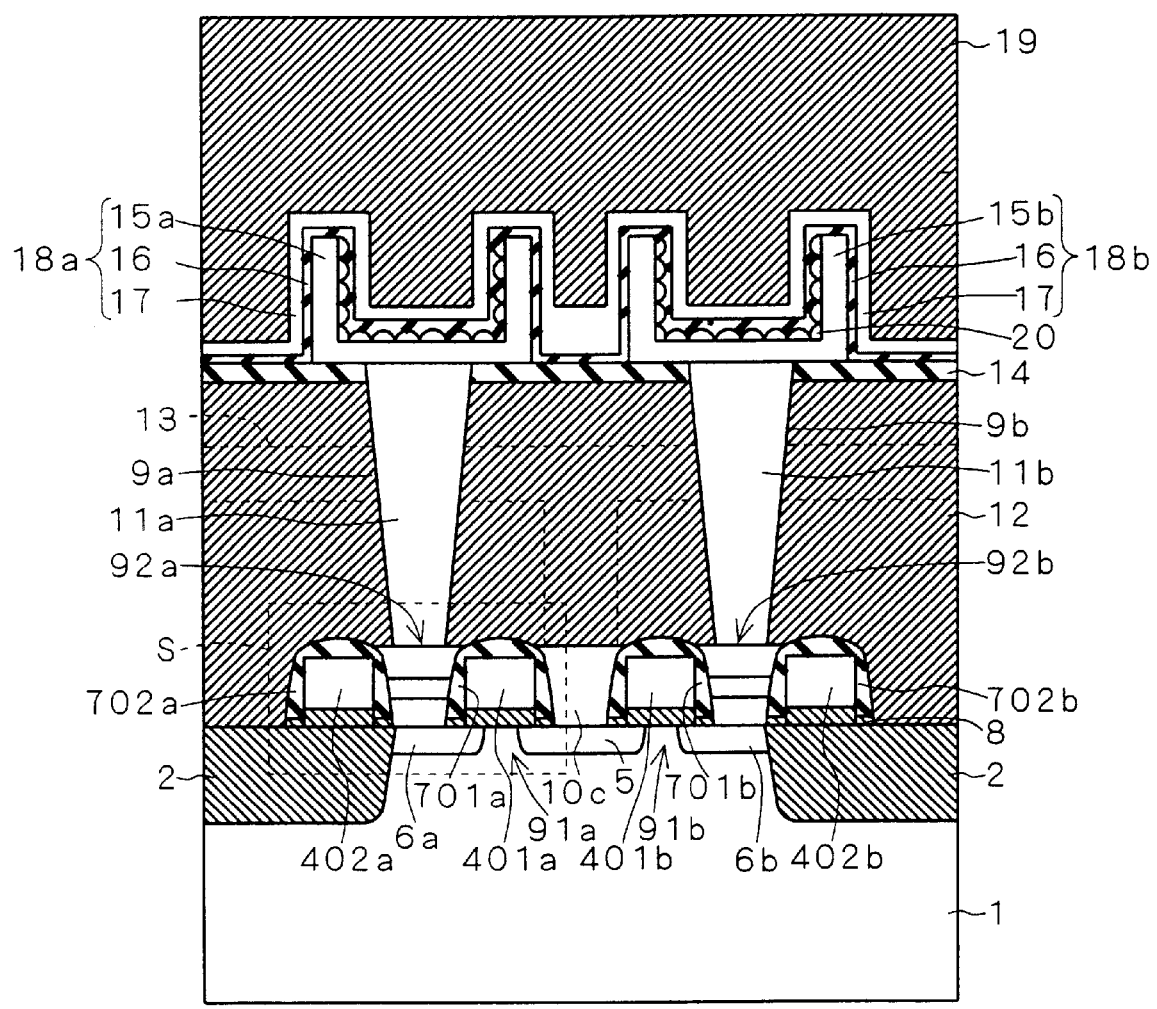
FIG. 18 is a cross-sectional view showing a structure of the memory cells according to a fifth preferred embodiment of the present invention.

FIG. 18 is a cross-sectional view of a structure of the pair of memory cells according to a fifth preferred embodiment of the present invention. The structure of FIG. 18 comprises vertical type MIS transistors 92a and 92b in place of the pads 10a and 10b, respectively, of the structure shown in FIG. 51.

Figure 19:
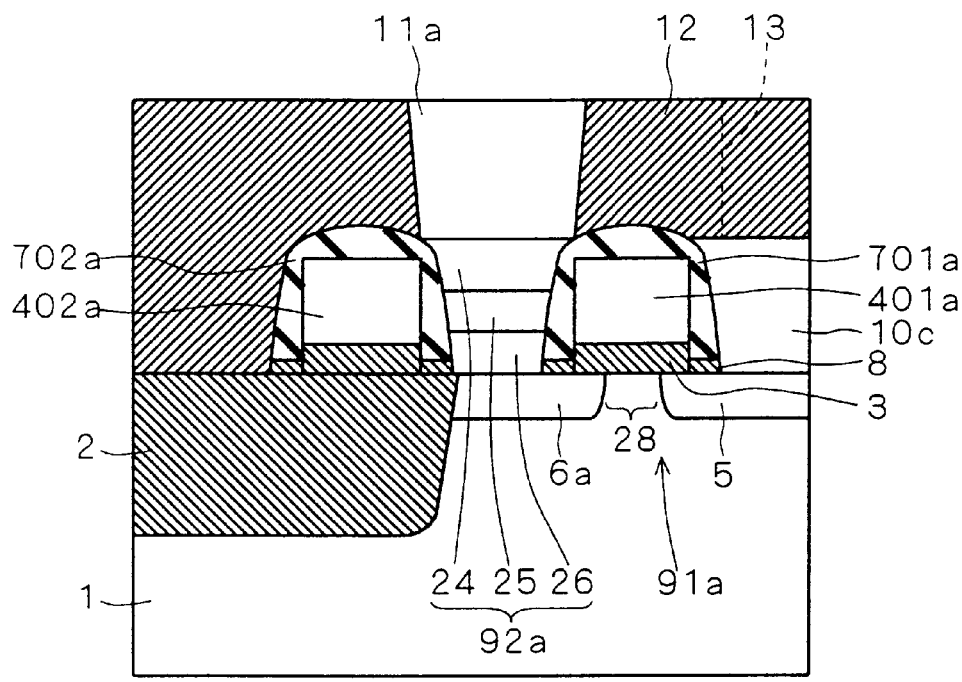
FIG. 19 is an enlarged cross-sectional view of a memory cell according to the fifth preferred embodiment of the present invention.

FIG. 19 is an enlarged cross-sectional view of a region S surrounding the MIS transistor 92a of FIG. 18. The MIS transistor 92a comprises a multilayer structure between the insulation films 701a and 702a, the multilayer structure including an n type source/drain region 26, a p type channel region 25, and an n type source/drain region 24 which are arranged in the order named as viewed from the semiconductor substrate 1. The n type source/drain region 24 is in contact with the storage node 11a, and the n type source/drain region 26 is in contact with the source/drain region 6a.

The insulation film 701a functions also as a gate insulation film for the transistor 92a. The transistor 92a is on/off controlled by the potential applied to the gate electrode 401a.

Figure 20:
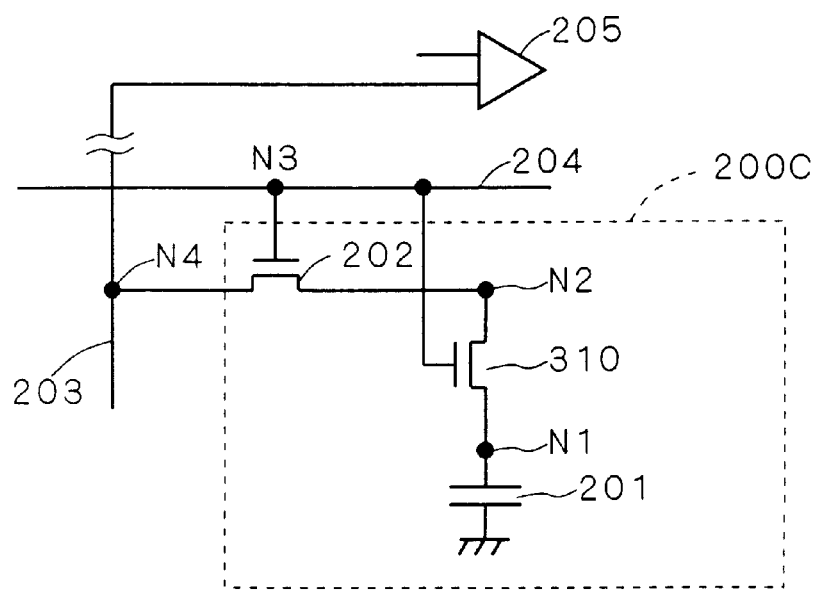
FIG. 20 is a circuit diagram of an equivalent circuit of the memory cell according to the fifth preferred embodiment of the present invention.

FIG. 20 is a circuit diagram of an equivalent circuit of a memory cell 200C having the above structure. The transistors 202, 310 and the capacitor 201 shown in FIG. 20 correspond to the transistors 91a, 92a and the capacitor 18a of FIG. 19, respectively. The connection points N1, N2, N3, and N4 of FIG. 20 correspond to the lower electrode 15a, the source/drain region 6a, the gate electrode 401a, and the source/drain region 5, respectively. The resistances of the storage node 11a and the pad 10c are neglected herein.

It is assumed that the power supply potential Vdd is 2 V, for example. For writing information into the memory cell comprising the transistor 91a and the capacitor 18a, the potential of the source/drain region 6a of the transistor 91a is set at 0 V, the potential of the bit line 13 is set at 2 V, and the potential of the gate electrode 401a is set at 4 V, for example. Under these conditions, inversion layers are formed in a channel region 28 of the transistor 91a and the channel region 25 of the transistor 92a to extend along the gate insulation film 3 and the insulation film 701a, respectively. Thus, electrons flow from the lower electrode 15a through the storage node 11a and the transistor 92a into the semiconductor substrate 1. Then, the potential of the lower electrode 15a reaches 2 V, and information is written into the capacitor 18a.

During the pause of the memory cell, on the other hand, the potential of the gate electrode 401a (the potential at the connection point N3 of FIG. 20) is set at 0 V and the potential of the bit line 13 (the potential at the connection point N4 of FIG. 20) is set at 1 V (=Vdd/2), for example, with the potential of the semiconductor substrate 1 held at −1 V. In this case, the potential of the lower electrode 15a (the potential at the connection point N1 of FIG. 20) is 2 V (=Vdd). The potential at the connection point N2 of FIG. 20 is given by Vdd−ΔV where ΔV is the saturation voltage of the transistor 310 (the transistor 92a of FIG. 19).

As above described, there is a likelihood that leakage current flows through the transistor 91a because of the current generated in the SRH process in the depletion layer of the transistor 91a and the TAT. The structure of the fifth preferred embodiment, however, is lower in leakage current than the structure shown in FIG. 51 since both of the transistor 91a and the transistor 92a lying between the transistor 91a and the capacitor 18a turn off. This provides increased refresh pause time, to attain a semiconductor device which is low in power consumption and high in efficiency with which the information stored in the memory is used.

In the above operation, it is desirable that the word line corresponding to the gate electrode 402a is not activated and is at a potential set, for example, at 0 V to prevent the memory cell comprising the transistor 91a from malfunctioning due to the electric field from the gate electrode 402a through the insulation film 702a. If the word line for the memory cell is not selected, it is desirable to apply a negative potential of −0.8 to −0.1 V to the gate electrodes 401a and 402a, thereby further reducing the leakage current through the transistor 92a.

Figure 21:
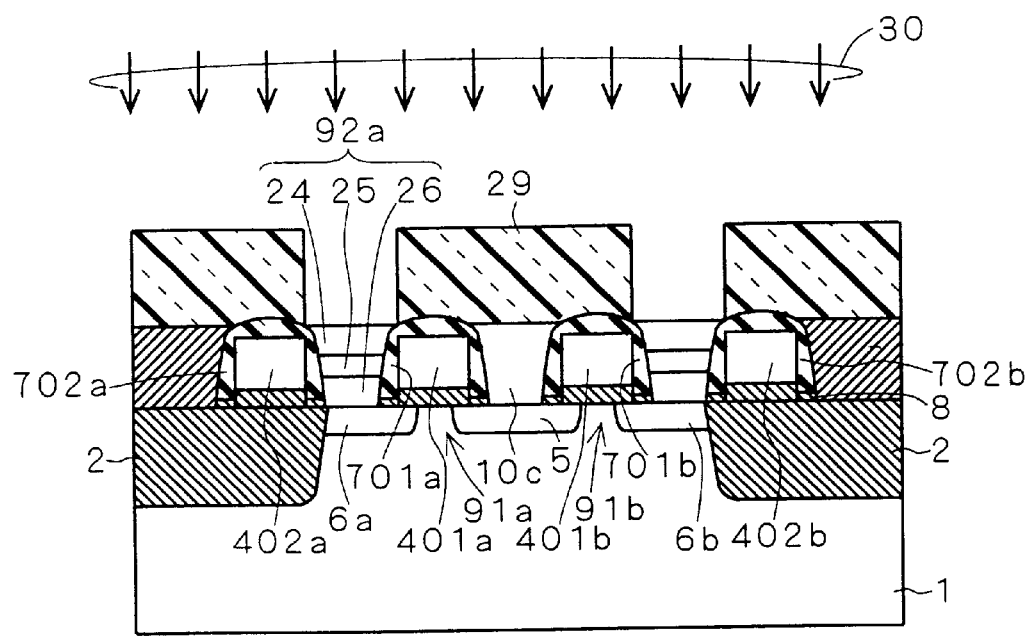
FIG. 21 is a cross-sectional view showing a first method of manufacturing the memory cells according to the fifth preferred embodiment of the present invention.

FIG. 21 is a cross-sectional view showing a first method of manufacturing the memory cell structure according to the fifth preferred embodiment. After the structure shown in FIG. 5 is produced in the steps described in the first preferred embodiment, a photoresist is applied to the structure and patterned through a transfer step, forming a photomask 29. The photomask 29 exposes only the pads 10a and 10b. Boron or $BF_2$ ions 30 are implanted into the pads 10a and 10b through the photomask 29 to form the p type channel region 25. This changes the pads 10a and 10b into the transistors 92a and 92b each having the source/drain region 26 closer to the semiconductor substrate 1 than the channel region 25 and the source/drain region 24 farther from the semiconductor substrate 1 than the channel region 25.

The amorphous polysilicon doped with phosphorus at a substantially constant concentration of, e.g., $1 \times 10^{20}/cm^3$ and deposited in the step of forming the pads 10a, 10b, 10c is used as it is for the source/drain regions 24 and 26 of the transistor 92. Alternatively, phosphorus ions may be additionally implanted into the structure shown in FIG. 21 so that the impurity concentration of the source/drain region 24 is higher than that of the source/drain region 26.

Then, the photomask 29 is removed, and the subsequent steps described in the first preferred embodiment are performed to provide the memory cell structure of the fifth preferred embodiment.

Figure 22:
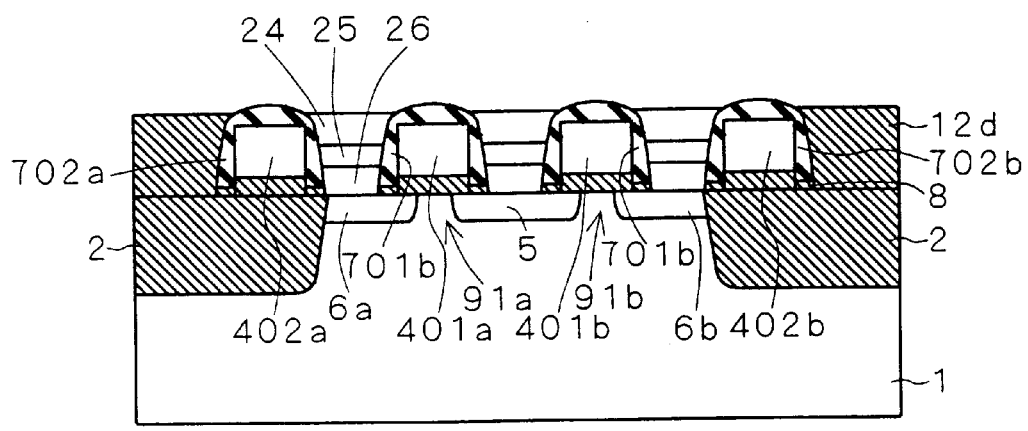
FIG. 22 is a cross-sectional view showing a second method of manufacturing the memory cells according to the fifth preferred embodiment of the present invention.

FIG. 22 is a cross-sectional view showing a second method of manufacturing the memory cell structure according to the fifth preferred embodiment. When gases are flowed in the following order: $PH_3$, $B_2H_6$ and $PH_3$ with the $SiH_4$ gas in the step of depositing amorphous silicon for the formation of the pads 10a, 10b, 10c by the CVD process, the amorphous silicon is doped with impurities in the following order: phosphorus, boron and phosphorus, thereby forming the source/drain region 26, the channel region 25 and the source/drain region 24 of the transistor 92 in sequential order. The dopant concentration is determined by the flow ratio of each dopant gas to the $SiH_4$ gas.

In the second method, not only the pads 10a, 10b in contact with the storage nodes 11a, 11b but also the pad 10c in contact with the bit line 13 are replaced with vertical type transistors. As illustrated in the second method, the vertical type transistor may be formed for the bit line 13. This is advantageous in eliminating the need to pattern the photoresist, to simplify the process steps.

Figure 23:
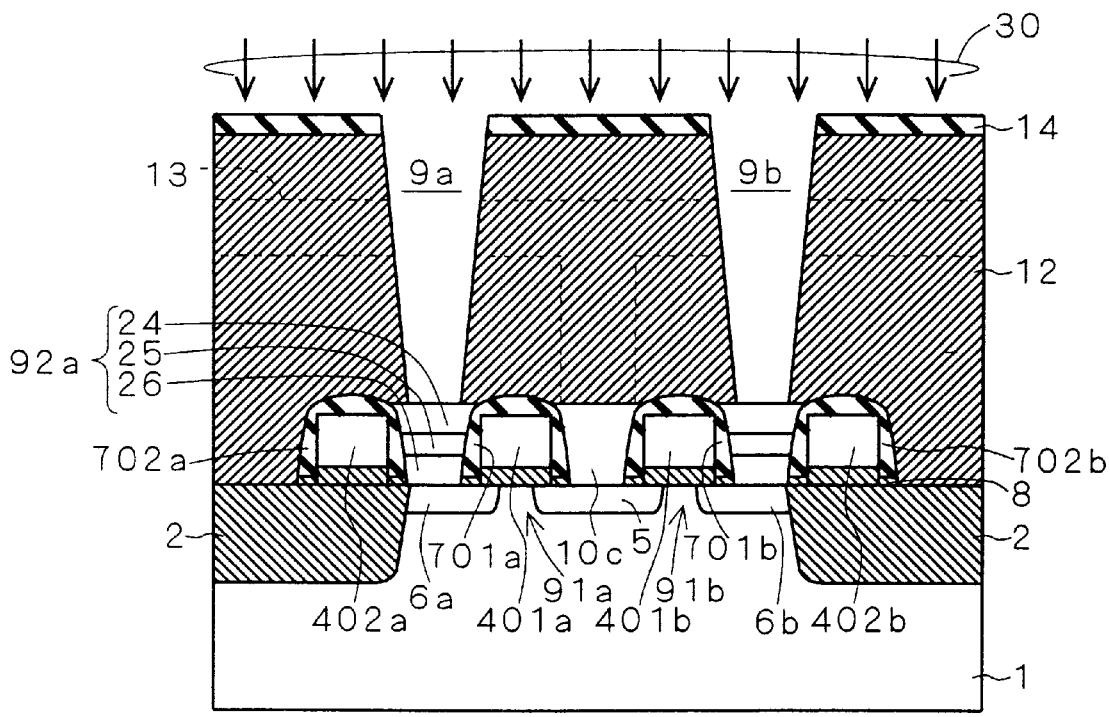
FIG. 23 is a cross-sectional view showing a third method of manufacturing the memory cells according to the fifth preferred embodiment of the present invention.

FIG. 23 is a cross-sectional view showing a third method of manufacturing the memory cell structure according to the fifth preferred embodiment. After the structure shown in FIG. 5 is produced in the steps described in the first preferred embodiment, a silicon oxide film is deposited thereon. After the bit line 13 is formed, a silicon oxide film is deposited again thereon to provide the interlayer insulation film 12. The silicon nitride film 14 is deposited on the interlayer insulation film 12. Using a patterned photoresist as a mask, reactive ion etching is performed to selectively remove the silicon nitride film 14 and the interlayer insulation film 12 over the pads 10a and 10b, forming the trenches 9a and 9b. The reactive ion etching substantially stops at the top of the pads 10a and 10b, and the photoresist mask on the silicon nitride film 14 is completely removed by overetching.

The boron or $BF_2$ ions 30 are implanted into the pads 10a and 10b through the trench 9 to form the p type channel region 25. This forms the transistor 92 in a manner similar to the first method of the fifth preferred embodiment. As in the first method, the amorphous polysilicon doped with phosphorus at a substantially constant concentration of, e.g., $1 \times 10^{20}/cm^3$ and deposited in the step of forming the pads 10a, 10b, 10c is used as it is for the source/drain regions 24 and 26 of the transistor 92. Alternatively, phosphorus ions may be additionally implanted into the structure shown in FIG. 23 so that the impurity concentration of the source/drain region 24 is higher than that of the source/drain region 26.

The subsequent steps described in the first preferred embodiment are performed to provide the memory cell structure of the fifth preferred embodiment.

FIGS. 24 through 27 are cross-sectional views showing a fourth method of manufacturing the memory cell structure according to the fifth preferred embodiment. After the structure shown in FIG. 4 is produced in the steps described in the first preferred embodiment, a silicon oxide film is formed using, e.g., TEOS on the entire surface of the structure shown in FIG. 4, and a patterned photoresist is formed on the silicon oxide film. Using the patterned photoresist as a mask, wet etching is performed to form trenches between the insulation films 701a and 702a and between the insulation films 701b and 702b, exposing the source/drain regions 5 and 6, with the silicon oxide film 12d left.

Figure 24:
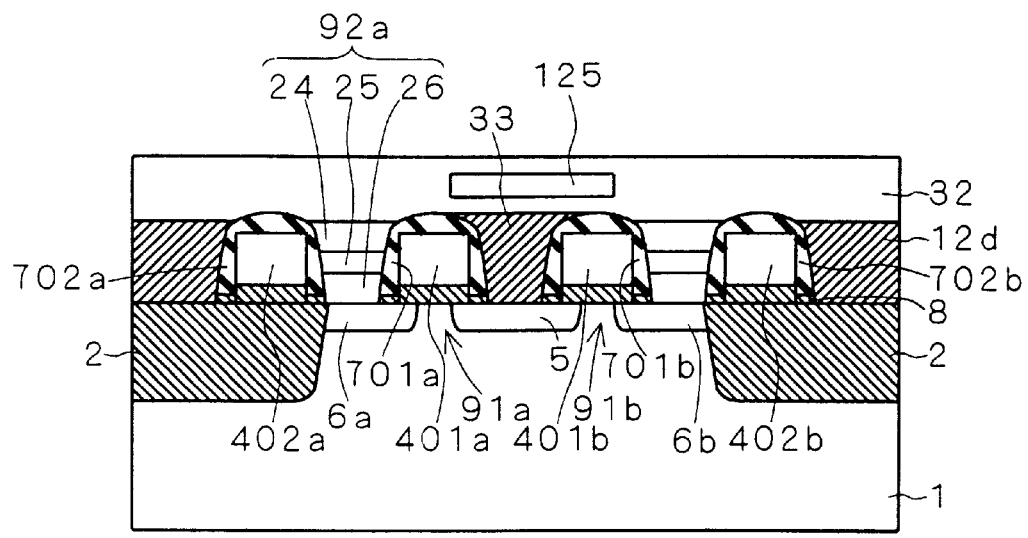
FIGS. 24 through 27 are cross-sectional views showing a fourth method of manufacturing the memory cells in a step-by-step manner according to the fifth preferred embodiment of the present invention.
Figure 25:
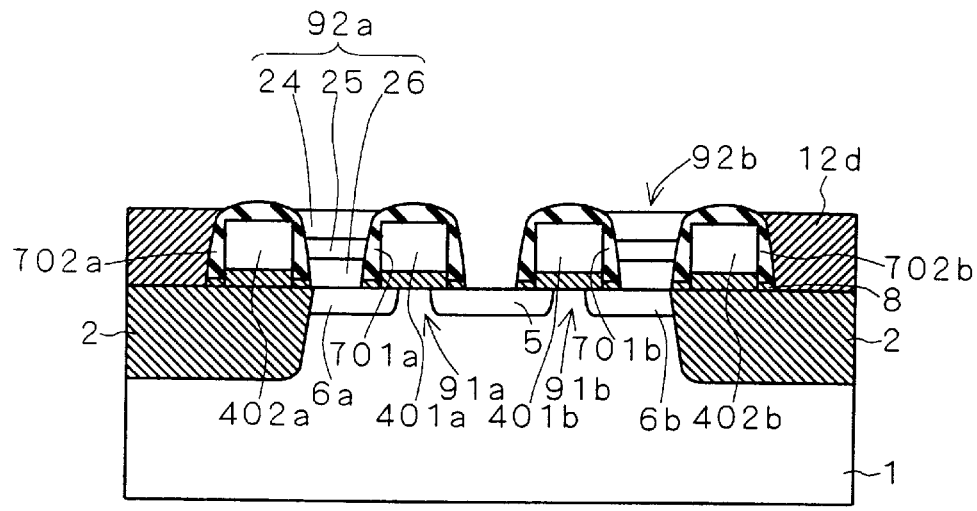

When gases are flowed in the following order: $PH_3$, $B_2H_6$ and $PH_3$ with the $SiH_4$ gas using the CVD equipment, the amorphous silicon is doped with impurities in the following order: phosphorus, boron and phosphorus, thereby forming the source/drain region 26, the channel region 25 and the source/drain region 24 of the transistor 92 in sequential order. At this time, an amorphous silicon layer 125 containing boron is formed over a silicon oxide film 33 that is part of the silicon oxide film 12d which remains between the insulation films 701a and 701b (FIG. 24).

The dopant concentration is determined by the flow ratio of each dopant gas to the $SiH_4$ gas. For example, the phosphorus concentration in the source/drain region 26 is set at $1 \times 10^{19}/cm^3$, the boron concentration in the channel region 25 is set at $5 \times 10^{18}/cm^3$, and the phosphorus concentration in the source/drain region 24 is set at $2 \times 10^{19}/cm^3$. The threshold voltage of the transistor 92 is dependent upon the thickness of the insulation film 701, the thickness and the boron concentration of the channel region 25.

Next, the CMP process is performed using the upper parts of the insulation films 701 and 702 as a stopper to planarize the silicon oxide film 12d and the source/drain region 24. In the CMP process, the amorphous silicon layer 125 is also removed. Further, the silicon oxide film 33 is removed. This provides the structure shown in FIG. 25.

Figure 26:
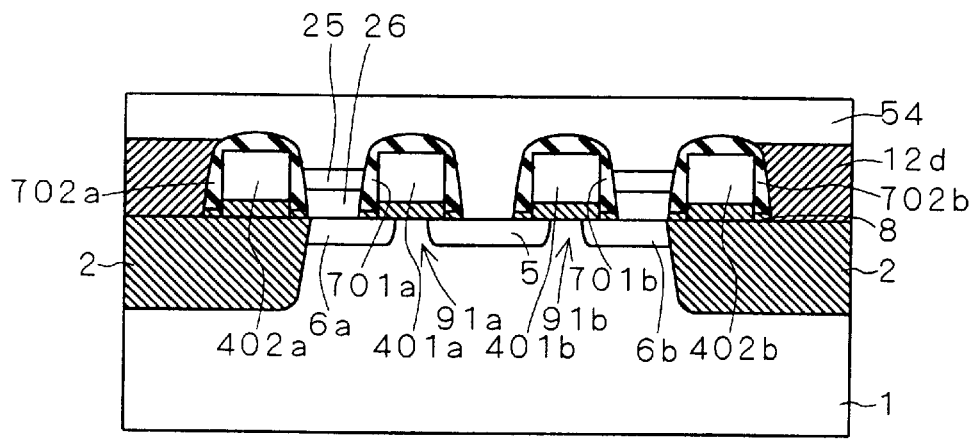
Figure 27:
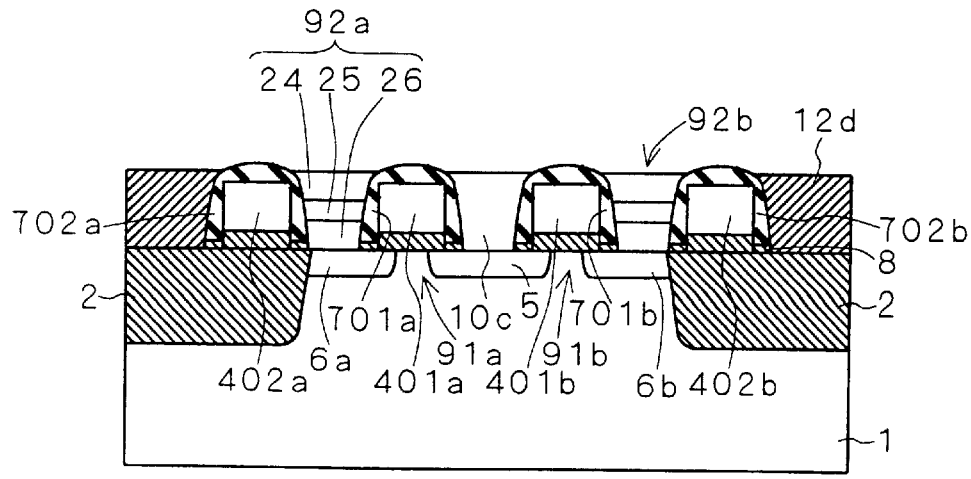

Next, amorphous silicon 54 doped with phosphorus at a concentration of $5 \times 10^{20}/cm^3$ is deposited using the CVD equipment again (FIG. 26). In this step, the space between the insulation films 701a and 701b is filled with the doped amorphous silicon.

Again, the CMP process is performed using the upper parts of the insulation films 701 and 702 as a stopper to planarize the silicon oxide film 12d and the source/drain region 24. This provides the structure shown in FIG. 27 which includes the pad 10c formed between the insulation films 701a and 701b, the vertical type transistor 92a formed between the insulation films 701a and 702a, and the vertical type transistor 92b formed between the insulation films 701b and 702b. The subsequent steps described in the first preferred embodiment are performed to provide the structure shown in FIG. 18.

As an example, $SiH_4$ is used in the above-mentioned step of forming the amorphous silicon film constituting the channel region 25 and the source/drain regions 24, 26 of the vertical type transistor 92. However, disilane, trisilane, dichlorosilane or the like may be used instead. Moreover, arsine, borane, diborane, triborane or the like may be used in place of phosphorus, and arsenic, boron or the like may be used as impurities.

The rugged polysilicon 20 described in the fourth preferred embodiment may be formed on the inner and outer surfaces of the lower electrode 15.

In this preferred embodiment, the vertical type transistor 92 may be replaced with a vertical type transistor having an LDD structure or a buried channel.

Figure 28:
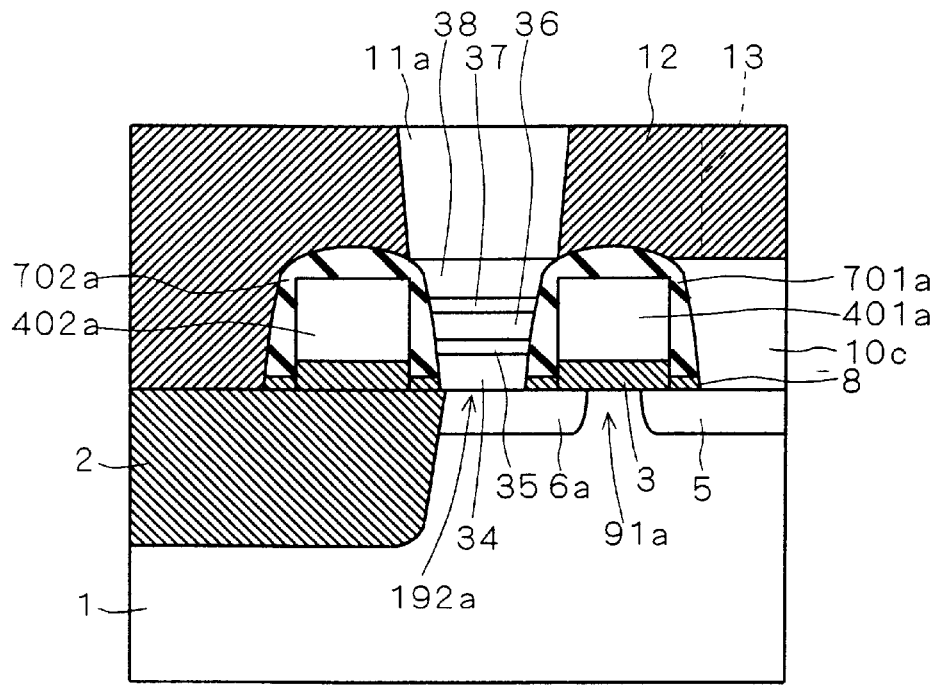
FIGS. 28 and 29 are cross-sectional views showing modifications of the memory cell according to the fifth preferred embodiment of the present invention.
Figure 29:
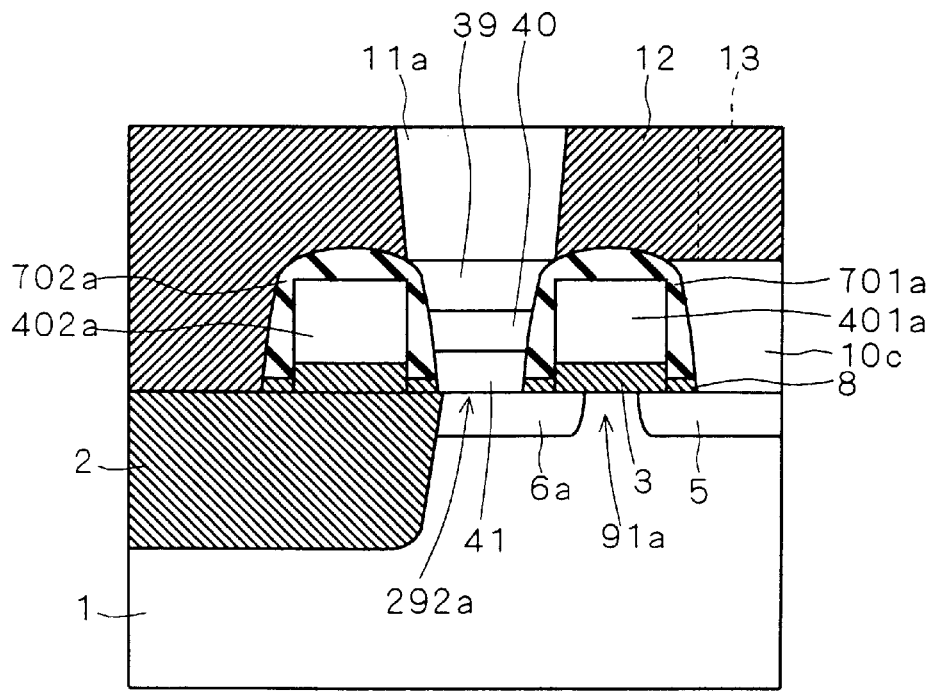

FIGS. 28 and 29 are enlarged cross-sectional views corresponding to a vicinity of the transistor 92 of FIG. 23. The structure of FIG. 28 is such that the transistor 92a is replaced with a transistor 192a having an LDD structure, and the structure of FIG. 29 is such that the transistor 92a is replaced with a vertical type transistor 292a having a buried channel.

Referring to FIG. 28, the transistor 192a comprises a multilayer structure including an $n^+$type source/drain region 34, an $n^-$type source/drain region 35, a p type channel region 36, an $n^-$type source/drain region 37, and an $n^+$type source/drain region 38 which are arranged in the order named as viewed from the source/drain region 6a.

If hot carriers are developed in the vertical type transistor lying between the storage node 11a and the source/drain region 6a, electrons are injected into the insulation films 701a, 702a, creating a trap in the insulation films 701a, 702a and an interface state at the interface between the insulation films 701a, 702a and the vertical type transistor. Such a phenomenon varies the threshold value and the drain current of the vertical type transistor, and the leakage current. In particular, the increase in leakage current resulting from the hot carrier degradation shortens the refresh pause time.

However, the use of the transistor 192a having the LDD structure as shown in FIG. 28 alleviates the electric field in the vicinity of the np junction to suppress the generation of hot carriers, as compared with the transistor 92a. Therefore, the structure shown in FIG. 28 increases the refresh pause time to suppress power consumption and enhance the efficiency with which the information stored in the memory is used.

Referring to FIG. 29, the transistor 292a comprises a multilayer structure including an n$^+$type source/drain region 39, an n$^-$type channel region 40, and an n$^+$type source/drain region 41 which are arranged in the order named as viewed from the source/drain region 6a. The transistor 292a can have a lower threshold voltage than the transistor 92a to perform the write/read operation at a higher speed.

The first to third manufacturing methods may be basically employed to manufacture the transistors 192a and 292a, in which case the dopant type and the concentration settings should be controlled. The transistors 91, 92, 192, 292 are shown hereinabove as being of the n channel type, but may be of the p channel type.

(c-2) Sixth Preferred Embodiment

The vertical type transistor 92 employed in the fifth preferred embodiment is replaced with the conventional pad 10. According to a sixth preferred embodiment of the present invention, the conventional pad 10 is used as it is, and a vertical type transistor is provided thereon.

Figure 30:
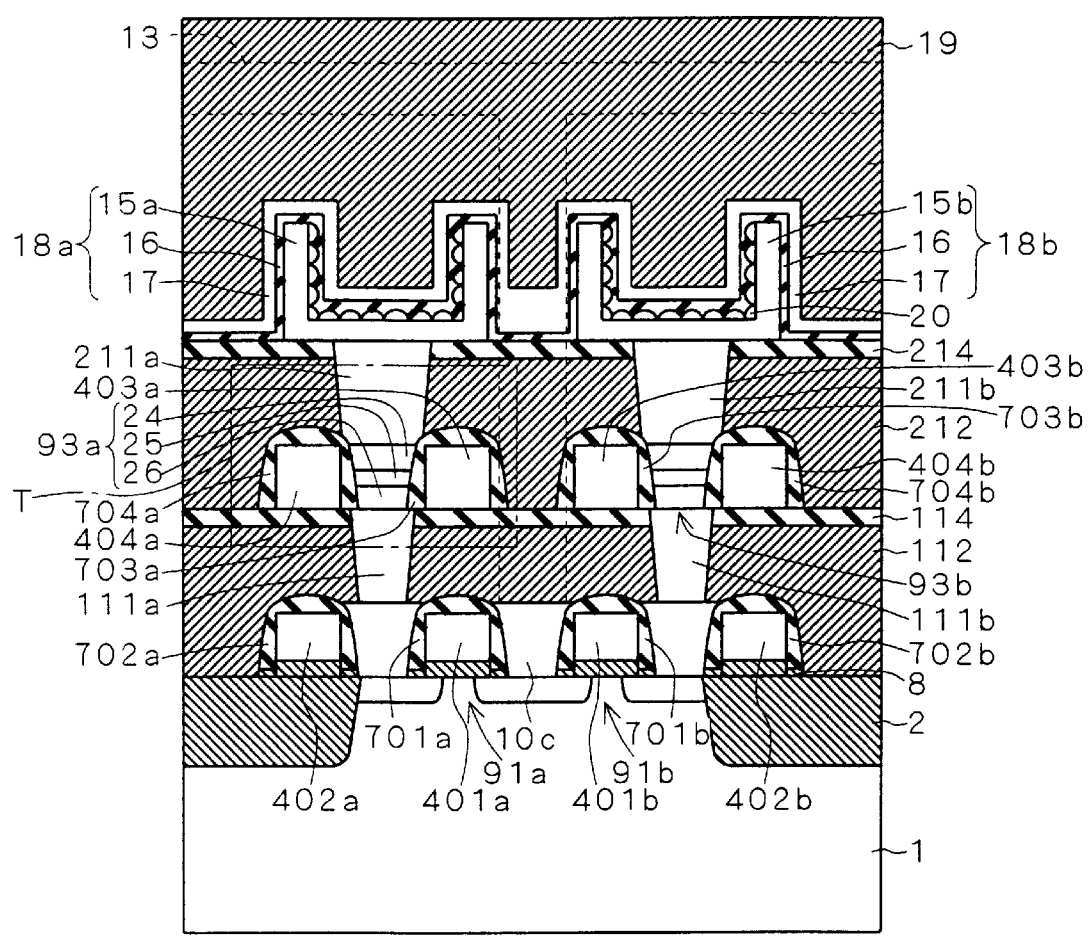
FIG. 30 is a cross-sectional view showing a structure of the memory cells according to a sixth preferred embodiment of the present invention.

FIG. 30 is a cross-sectional view of a structure of the pair of memory cells according to the sixth preferred embodiment of the present invention. The structure of FIG. 30 is similar to that of FIG. 51 in comprising the semiconductor substrate 1, the isolating insulation film 2, the MOS transistor 91, the gate electrodes 401, 402, and the pads 10a, 10b, 10c. The structure of FIG. 30 further comprises a lower storage node 111, the interlayer insulation film 112, and the silicon nitride film 114 which correspond to the storage node 11, the interlayer insulation film 12 and the silicon nitride film 14 shown in FIG. 51, respectively. The interlayer insulation film 112 differs from the interlayer insulation film 12 in that the bit line 13 is not provided therein in parallel with the semiconductor substrate 1 and that the pad 10c is connected to the bit line 13 through a through hole indicated by broken lines.

On the silicon nitride film 114 are provided gate electrodes 403, 404, insulation films 703, 704, an upper storage node 211, the interlayer insulation film 212, a vertical type transistor 93 and the silicon nitride film 214 which correspond to the gate electrodes 401, 402, the insulation films 701, 702, the storage node 11, the interlayer insulation film 12, the vertical type transistor 92 and the silicon nitride film 14 shown in FIG. 18, respectively. The capacitor 18 similar to that of the structure shown in FIG. 18 is formed on the silicon nitride film 214. The sixth preferred embodiment differs from the fifth preferred embodiment shown in FIG. 18 in that the bit line 13 is not provided in parallel with the semiconductor substrate 1 in the interlayer insulation film 212, but is provided in parallel with the semiconductor substrate 1 in the interlayer insulation film 19, and that the bit line 13 is connected to the pad 10c through a through hole indicated by broken lines. Further, the gate insulation film 3 and the insulation film 8 shown in FIG. 18 are not provided under the insulation films 703, 704 since the insulation films 703, 704 are not in direct contact with semiconductor which constitutes a transistor other than the transistor 93.

Figure 31:
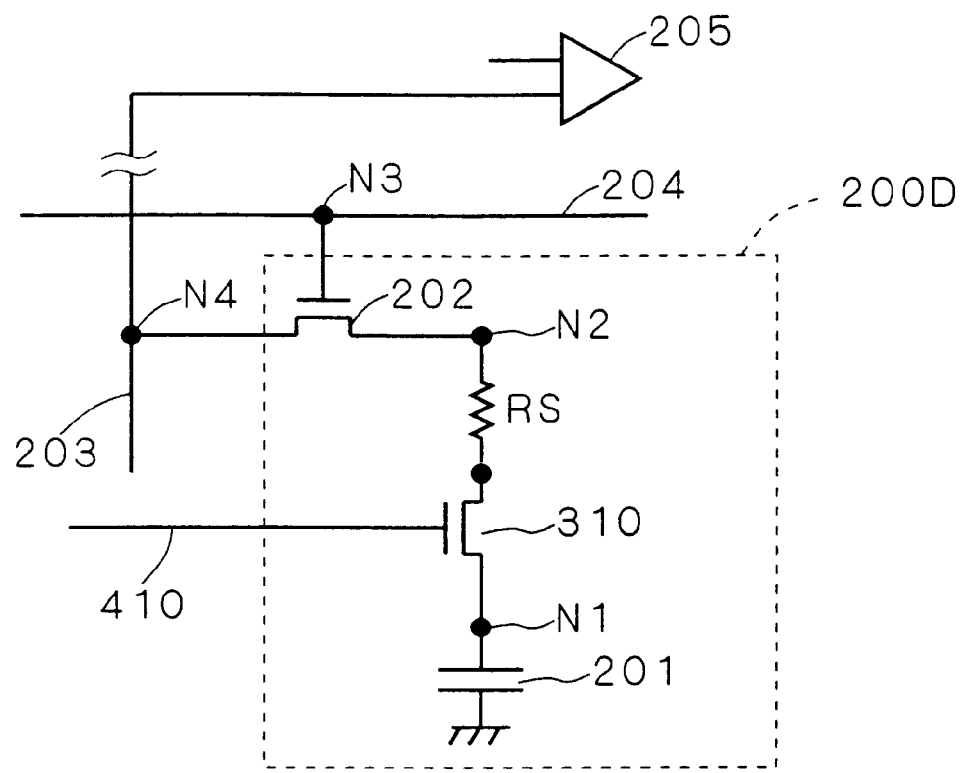
FIG. 31 is a circuit diagram of an equivalent circuit of the memory cell according to the sixth preferred embodiment of the present invention.

FIG. 31 is a circuit diagram of an equivalent circuit of a memory cell 200D having the above-mentioned structure. The transistors 202, 310, the capacitor 201, the word line 204, and a second word line 410 shown in FIG. 31 correspond to the transistors 91a, 93a, the capacitor 18a, the gate electrode 401a, and the gate electrode 403a of FIG. 30, respectively. The connection points N1, N2, N3, and N4 correspond to the lower electrode 15a, the source/drain region 6a, the gate electrode 401a, and the source/drain region 5, respectively. A resistor RS corresponds to a combined resistor including the resistance of the lower storage node 111a and the resistance of the upper storage node 211a, and the resistance of the pad 10c is neglected. If the resistor RS is neglected, the memory cell 200D differs from the memory cell 200C of FIG. 20 in that the gate of the transistor 310 is connected to the second word line 410, rather than the word line 204.

Figure 32:
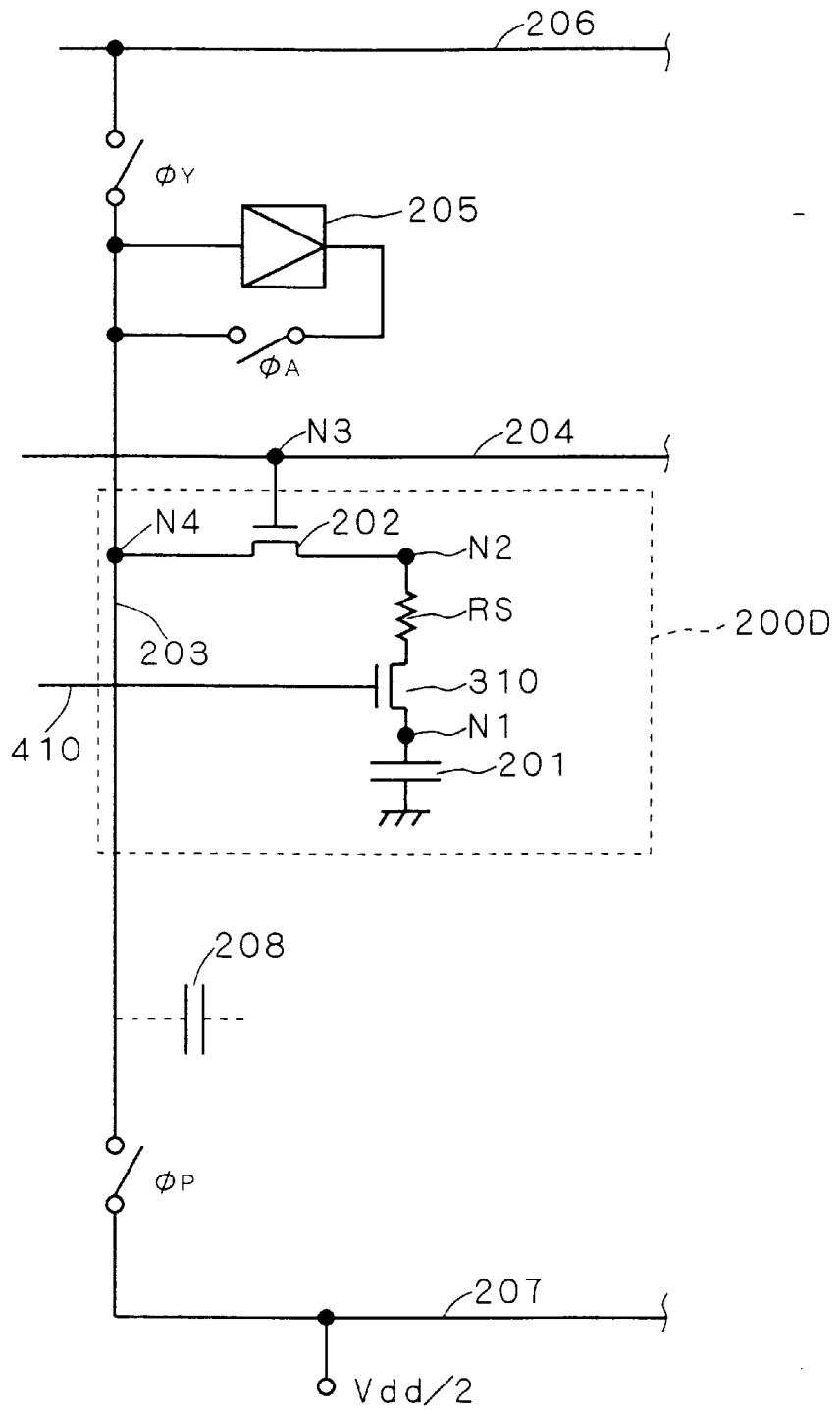
FIG. 32 is a circuit diagram illustrating the operation of the memory cell according to the sixth preferred embodiment of the present invention.

FIG. 32 is a circuit diagram for illustrating various operations of the memory cell 200D. The bit line 203 is connected to a sense amplifier 205 and is also connected to an input/output line 206 through a bit line selection switch ϕY. The bit line 203 is further connected to a precharge line 207 through a precharge switch ϕP. The potential of the precharge line 207 is normally set at Vdd/2 where Vdd is the power supply potential.

A precharge operation is carried out by turning on the precharge switch ϕP with the bit line selection switch ϕY in the off state, and the potential of the bit line 203 is set at Vdd/2. This potential is held by a floating capacitor 208 of the bit line 203.

Figure 33:
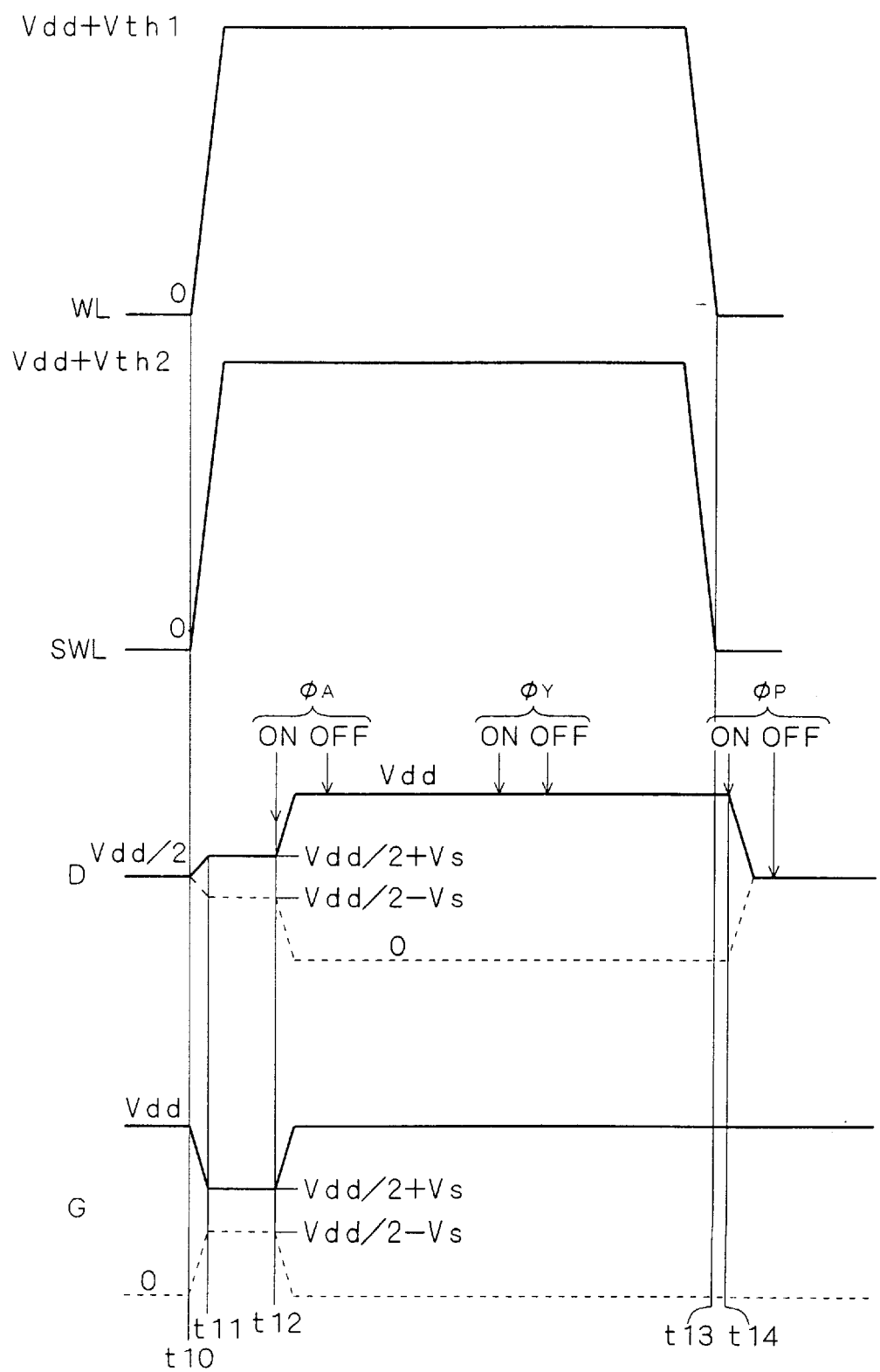
FIGS. 33 through 36 are timing diagrams showing the operation of the memory cell according to the sixth preferred embodiment of the present invention.

FIG. 33 is a timing diagram showing the read operation of the memory cell 200D. In FIG. 33, WL denotes the potential of the word line 204 (i.e., the potential at the connection point N3); SWL denotes the potential of the second word line 410 (i.e., the potential of the transistor 310), D denotes the potential of the bit line 203 (i.e., the potential at the connection point N4), and G denotes the potential at the connection point N1.

The potential G is assumed to be held at Vdd by the capacitor 201 before the time t10 (as indicated by a solid line). At the time t10, the potentials WL and SWL are set at Vdd+Vth1 and Vdd+Vth2, respectively, to turn on the transistors 202 and 310 where Vth1 is the threshold voltage of the transistor 202 and Vth2 is the threshold voltage of the transistor 310. The potentials WL and SWL may be set at greater than Vdd+Vth1 and Vdd+Vth2, respectively. For example, setting of the potentials WL and SWL commonly at Vdd+Vth1+Vth2 may eliminate the need for a booster circuit.

Since the transistors 202 and 310 turn on at the time t10, electric charge distribution takes place between the capacitance Cs of the capacitor 201 and the capacitance Cd of the floating capacitor 208 with a time constant dependent upon the combined resistor RS to reach an equilibrium at the time t11. Then, the potentials D and G are equal at Vdd/2+Vs where Vs=(Vdd/2) Cs/(Cs+Cd). The sense amplifier 205 compares the potential D with the precharge potential, Vdd/2, which has been applied from the bit line 203. Since D>Vdd/2, the output from the sense amplifier is at the potential Vdd. At the time t12 after the time t11, a sense amplifier switch ϕS turns on. When the potential D of the bit line 203 increases up to the potential Vdd, the sense amplifier switch ϕS turns off.

Next, the bit line selection switch ϕY turns on to apply the potential Vdd to the input/output line 206. Thereafter, the bit line selection switch ϕY turns off. At the time t13, both of the potentials WL and SWL are set at zero to turn off the transistors 202 and 310. Then, at the time t14, the precharge switch ϕP is turned on. After the potential D reaches Vdd/2, the precharge switch ϕP turns off.

If the potential G equals zero before the time t10 (as indicated by a broken line), the potentials D and G become equal at Vdd/2−Vs at the time t11, and the output potential from the sense amplifier reaches zero.

Figure 34:
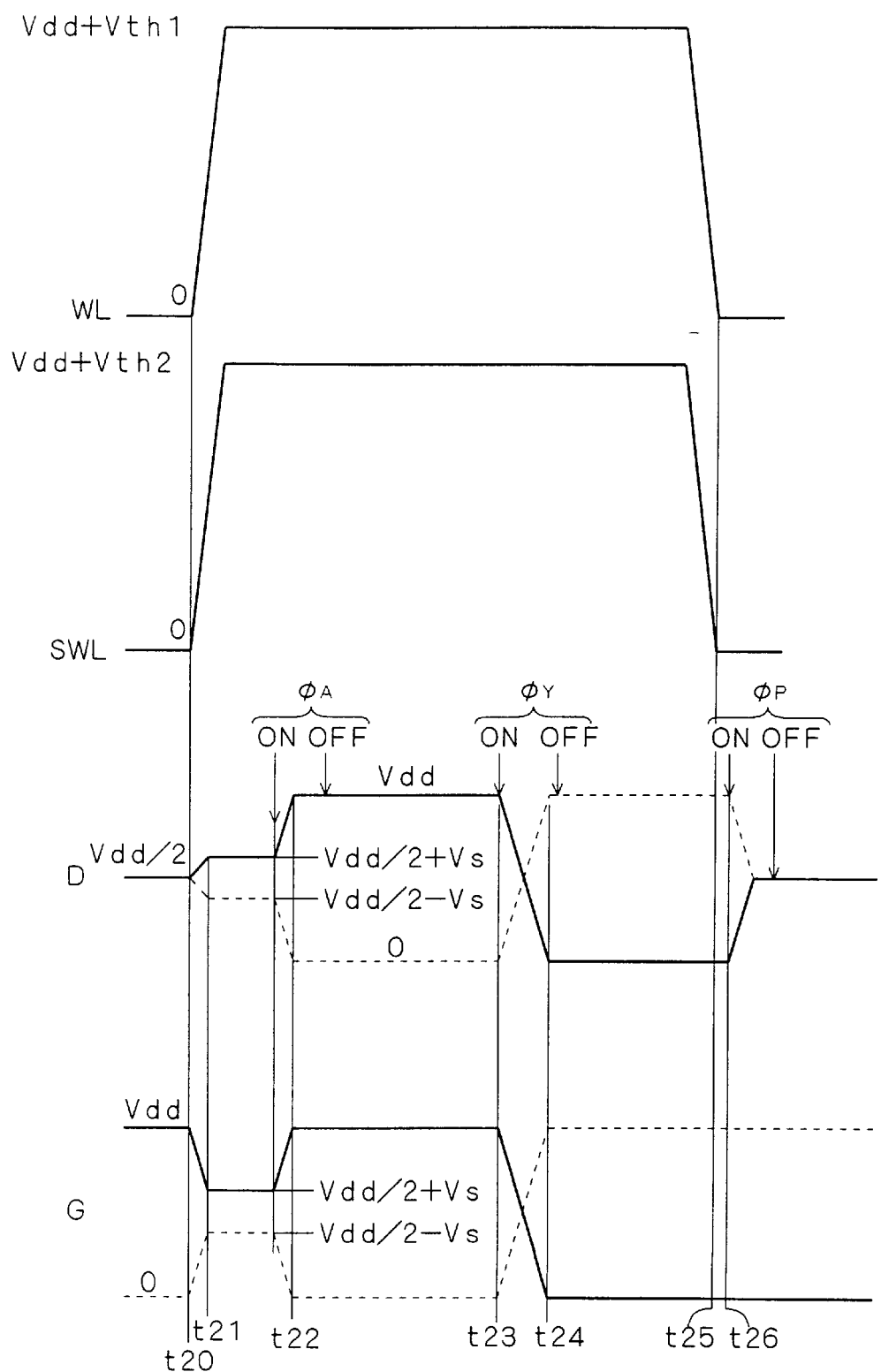

FIG. 34 is a timing diagram showing the write operation of the memory cell 200D. The potential G is assumed to be held at Vdd by the capacitor 201 before the time t20 (as indicated by a solid line). At the time t20, the potentials WL and SWL are set at Vdd+Vth1 and Vdd+Vth2, respectively, to turn on the transistors 202 and 310. This allows the potentials D and G to become equal at Vdd/2+Vs at the time t21, and the output potential from the sense amplifier reaches Vdd. At the time t22, the sense amplifier switch φS turns on so that the memory cell 200D performs the read operation once. This prevents the write operation from destroying the information stored in other memory cells which are connected to the word line 204 but are not to be written. In other words, a potential corresponding to the information stored in a memory cell which is not selected is applied to the bit line for that memory cell.

The write operation which changes the potential G of the capacitor 201 to zero will be illustrated. At the time t23, the bit line selection switch φY turns on to apply the zero potential from the input/output line 206 to the bit line 203. Since the transistors 202 and 310 are on at this time, the potential D of the capacitor 201 reaches zero with the time constant dependent upon the combined resistor RS (at the time t24). Subsequently, the bit line selection switch φY turns off. Thereafter, as in the read operation, both of the potentials WL and SWL are set at zero at the time t25 to turn off the transistors 202 and 310. Then, at the time t26, the precharge switch φP is turned on. After the potential D reaches Vdd/2, the precharge switch φP turns off.

The refresh operation is the same as the read operation. In the refresh operation, all of the memory cells connected to the word line 204 are refreshed simultaneously.

Figure 35:
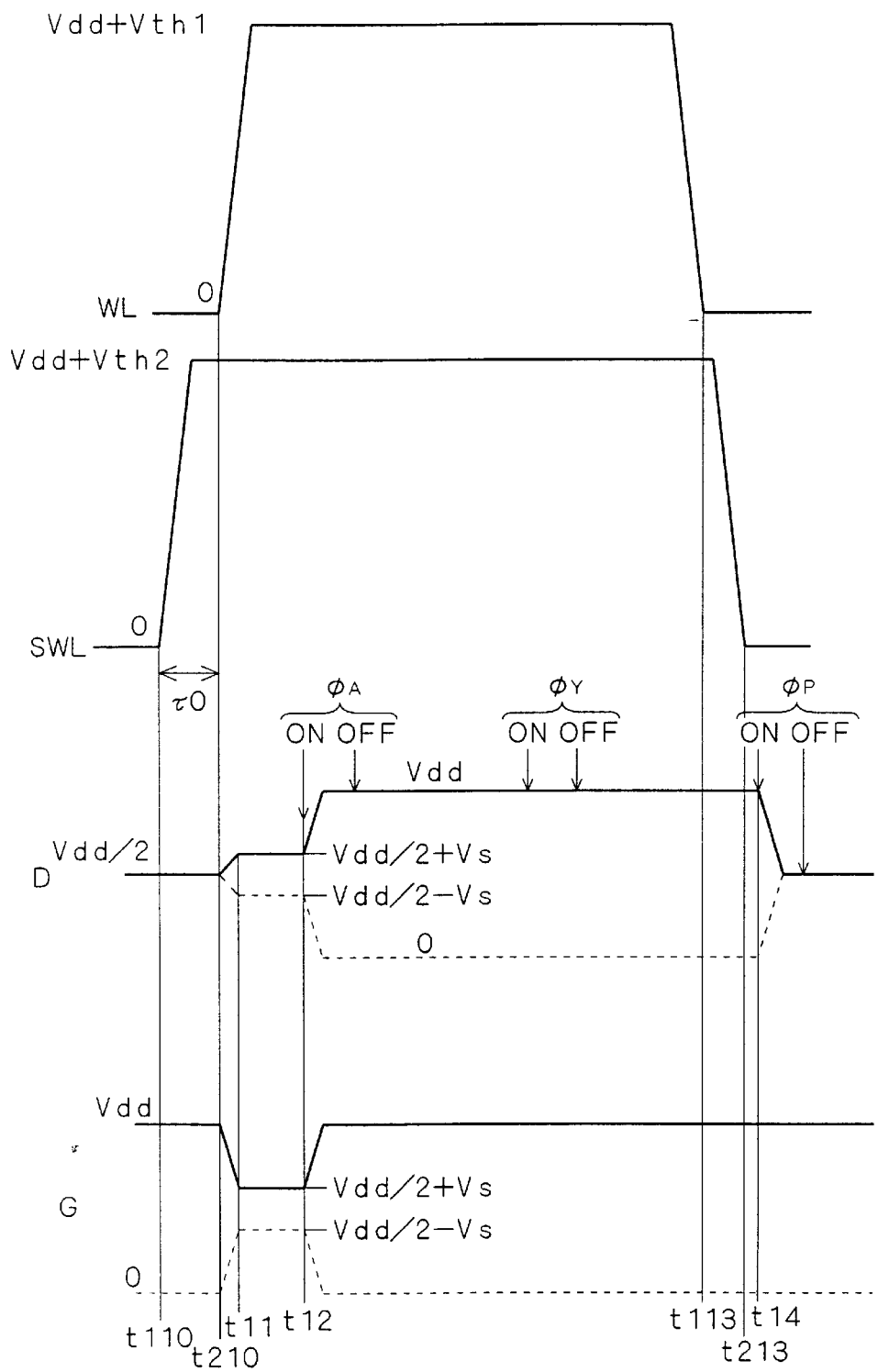
Figure 36:
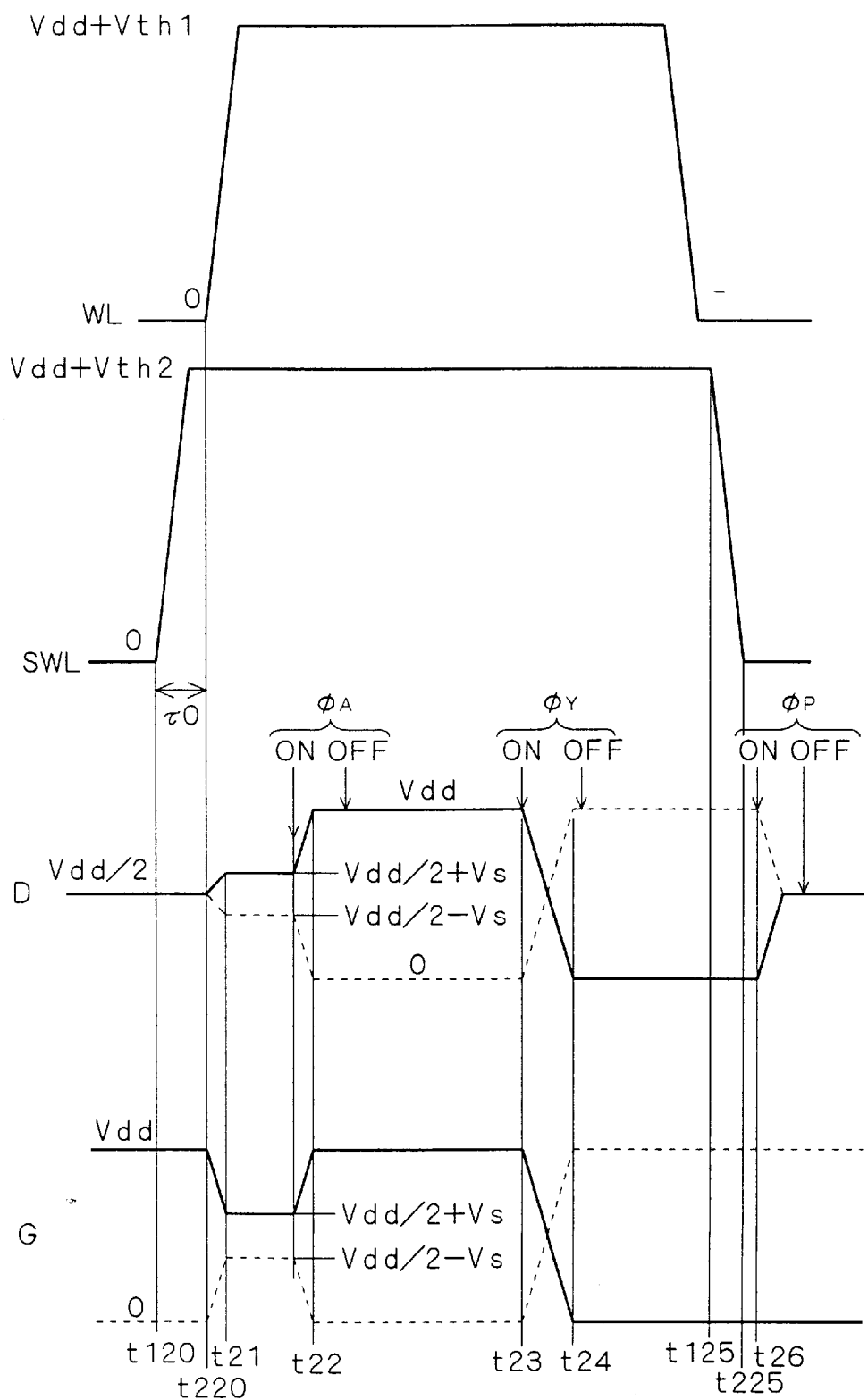

The potential SWL may be caused to lead the potential WL by a phase difference τ0, thereby alleviating a delay in changes in the potentials D and G due to the time constant dependent upon the resistor RS. FIGS. 35 and 36 are timing diagrams showing the read and write operations of the memory cell 200D, respectively.

In the read operation, the potential G is assumed to be held at Vdd by the capacitor 201 before the time t110 (as indicated by a solid line; the operation when the potential G equals zero before the time t110 is indicated by a broken line). At the time t110, the potential SWL is set at not less than Vdd+Vth2 to turn on the transistor 310. Then, at the time t210 (=t110+τ0), the potential WL is set at not less than Vdd+Vth1 to turn on the transistor 202. This causes the potentials D and G to make a transition to the potential Vdd/2.

The subsequent operation described with reference to FIG. 33 is performed. The potentials SWL and WL are set at zero at the time t113 and at the time t213, respectively, to turn off the transistors 310 and 202 in this order. Then, at the time t14, the precharge switch φP is turned on. After the potential D reaches Vdd/2, the precharge switch φP turns off.

Likewise, the write operation will be described in which the potential G held at Vdd by the capacitor 201 before the time t120 is rewritten to zero (as indicated by a solid line; the operation when the potential G equaling zero before the time t120 is rewritten to Vdd is indicated by a broken line). At the time t120, the potential SWL is set at not less than Vdd+Vth2 to turn on the transistor 310. Then, at the time t220 (=t120+τ0), the potential WL is set at not less than Vdd+Vth1 to turn on the transistor 202. This causes the potentials D and G to make a transition to the potential Vdd/2.

The subsequent operation described with reference to FIG. 34 is performed. The potentials SWL and WL are set at zero at the time t125 and at the time t225, respectively, to turn off the transistors 310 and 202 in this order. Then, at the time t26, the precharge switch φP is turned on. After the potential D reaches Vdd/2, the precharge switch φP turns off.

In the above described read operation (including the refresh operation) and write operation, the turning on of the transistor 310 precedes the turning on of the transistor 202, which decreases the time constant dependent upon the resistor RS to increase the speed of transition of the potentials D and G. Thus, the read operation and the write operation are performed rapidly. Moreover, it is desirable to set the potentials SWL and WL at a negative potential ranging from −0.8 to −0.1 V, rather than 0 V, when the memory cell 200D is not selected, thereby further reducing the leakage current during the pause.

Unlike the fifth preferred embodiment, the vertical type transistor 93 may differ in conductivity type from the transistor 91 which is the cell transistor in the sixth preferred embodiment, in which case the potentials SWL and WL make a transition in generally complementary relationship if the phase difference τ0 is neglected.

Figure 37:
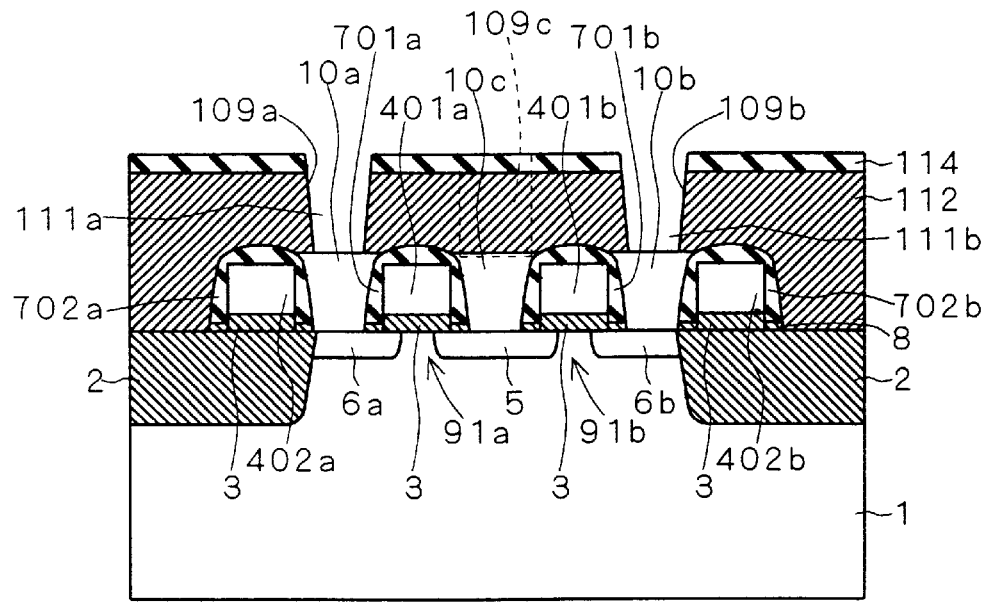
FIGS. 37 through 40 are cross-sectional views showing a method of manufacturing the memory cells in a step-by-step manner according to the sixth preferred embodiment of the present invention.
Figure 38:
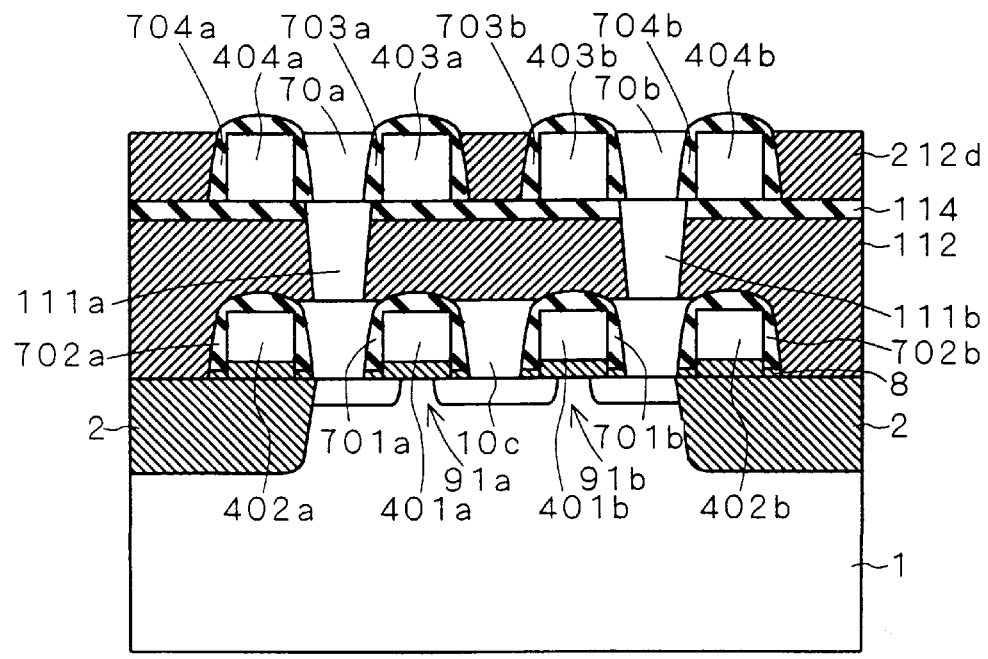
Figure 39:
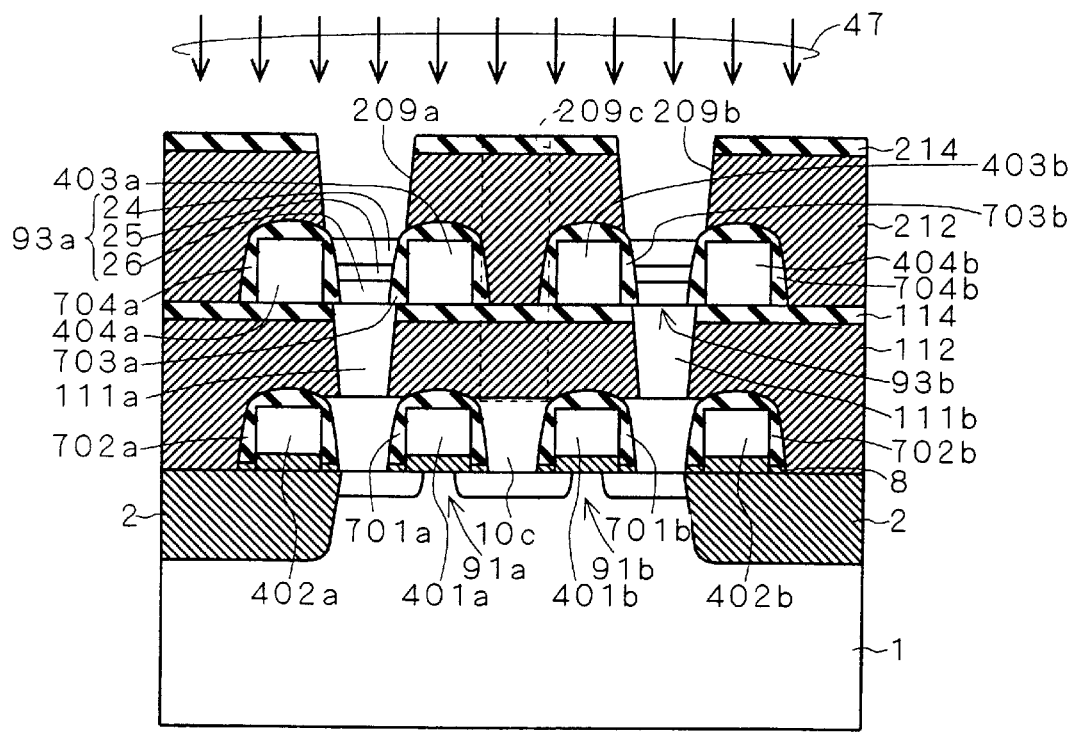
Figure 40:
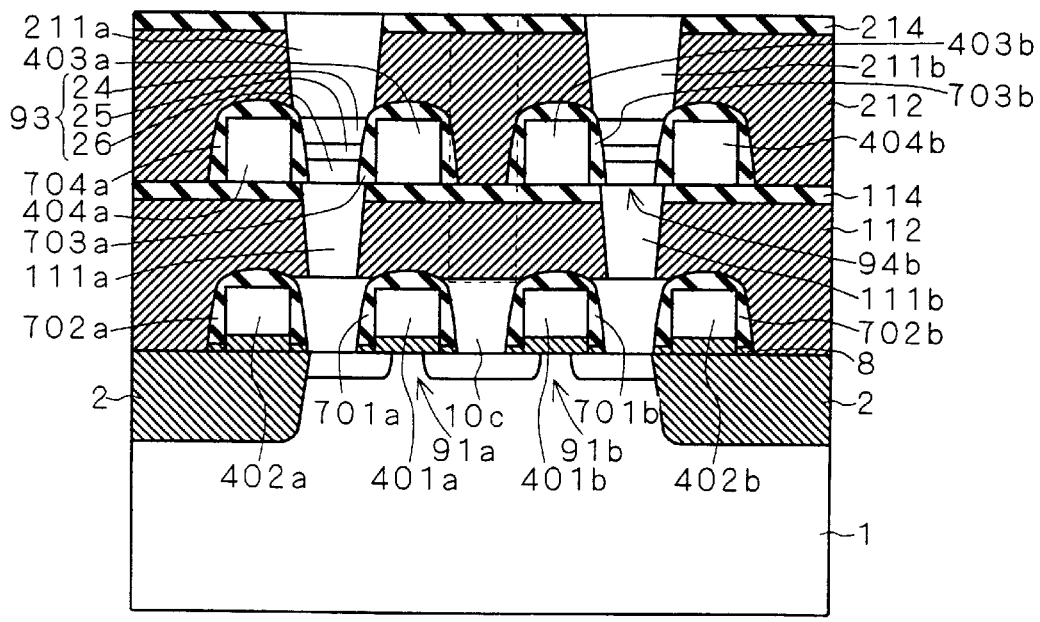

FIGS. 37 through 40 are cross-sectional views showing a method of manufacturing the structure shown in FIG. 30 in a step-by-step manner. The structure shown in FIG. 37 is obtained in the steps of producing the structure of FIG. 6 in the first preferred embodiment. The storage nodes 11a, 11b, the interlayer insulation film 12, the silicon nitride film 14, and the trenches 9a, 9b shown in FIG. 6 are named in FIGS. 37 through 40 as the lower storage nodes 111a, 111b, the interlayer insulation film 112, the silicon nitride film 114, and trenches 109a, 109b, respectively. The step of providing the bit line 13 in the interlayer insulation film 112 is eliminated in this method. Instead, this method comprises the steps of forming a through hole 109c extending to the pad 10c at the same time that the trenches 109a, 109b are formed, and filling the through hole 109c with conductor at the same time that the lower storage nodes 111a, 111b are formed. The through hole 109c does not appear in the plane of the cross section of FIG. 37 but is indicated by the broken lines.

Next, a three-layered TiN/W/TiN film serving as a gate electrode material is deposited on the resultant structure, and an antireflective film is deposited on the three-layered TiN/W/TiN film. A photoresist is applied to the antireflective film, and is patterned. Using the patterned photoresist as a mask, reactive ion etching is performed to form the gate electrodes 403 and 404. Next, a silicon nitride film is deposited, and reactive ion etching is performed to form the insulation films 703, 704 covering the gate electrodes 403, 404. A silicon oxide film formed, e.g., by the CVD process using TEOS is deposited to fill the space between the insulation films 703, 704. A photoresist is applied to the silicon oxide film and is patterned. Using the patterned photoresist as a mask, the silicon oxide film is etched to expose the upper parts of the insulation films 703, 704. Thus, a silicon oxide film 212d is left in a region outside the insulation film 704a as viewed from the insulation film 703a and in a region outside the insulation film 704b as viewed from the insulation film 703b.

Phosphorus-doped amorphous silicon is deposited to fill a region lying between the insulation films 703a and 704a and a region lying between the insulation films 703b and 704b.

The CMP process is performed using the silicon oxide film 212d and the upper parts of the insulation films 703, 704 as a stopper to leave amorphous silicon 70a and 70b in the regions lying between the insulation films 703a and 704a and between the insulation films 703b and 704b, respectively. This provides the structure shown in FIG. 38.

A silicon oxide film formed, e.g., by the CVD process using TEOS is deposited. This silicon oxide film and the silicon oxide film 212d form the interlayer insulation film 212. The silicon nitride film 214 is deposited on the interlayer insulation film 212. A photoresist is applied to the silicon nitride film 214 and is patterned. Using the patterned photoresist as a mask, reactive ion etching is performed to form trenches 209a, 209b which expose the amorphous silicon 70a, 70b, respectively, and a through hole 209c communicating with the through hole 109c.

Boron ions 47 are implanted into the amorphous silicon 70 to provide the p type channel region 25 of the vertical type transistor 93. The amorphous silicon 70 is left as the n type source/drain region 26 closer to the semiconductor substrate 1 than the p type channel region 25 and as the n type source/drain region 24 farther from the semiconductor substrate 1 than the p type channel region 25. This provides the structure shown in FIG. 39. Of course, phosphorus or arsenic ions may be implanted as required to increase the impurity concentration of the n type source/drain regions 24, 26. Further, a vertical type transistor may be formed in the through hole 209c.

Next, phosphorus-doped amorphous silicon is deposited by the CVD process to fill the trenches 209a, 209b, 209c. The CMP process is performed using the silicon nitride film 214 as a stopper to remove part of the amorphous silicon which lies above the silicon nitride film 214, forming the upper storage nodes 211a, 211b. A conductor electrically connected to the pad 10c is formed in the trench 209c. This provides the structure shown in FIG. 40. Thereafter, the subsequent steps described in the first preferred embodiment are performed to form the capacitor 18 and the interlayer insulation film 19, and the bit line 13 is installed in the interlayer insulation film 19.

Similar to the transistor 92 of the fifth preferred embodiment, the transistor 93 may be replaced with a vertical type transistor having an LDD structure or a buried channel.

Figure 41:
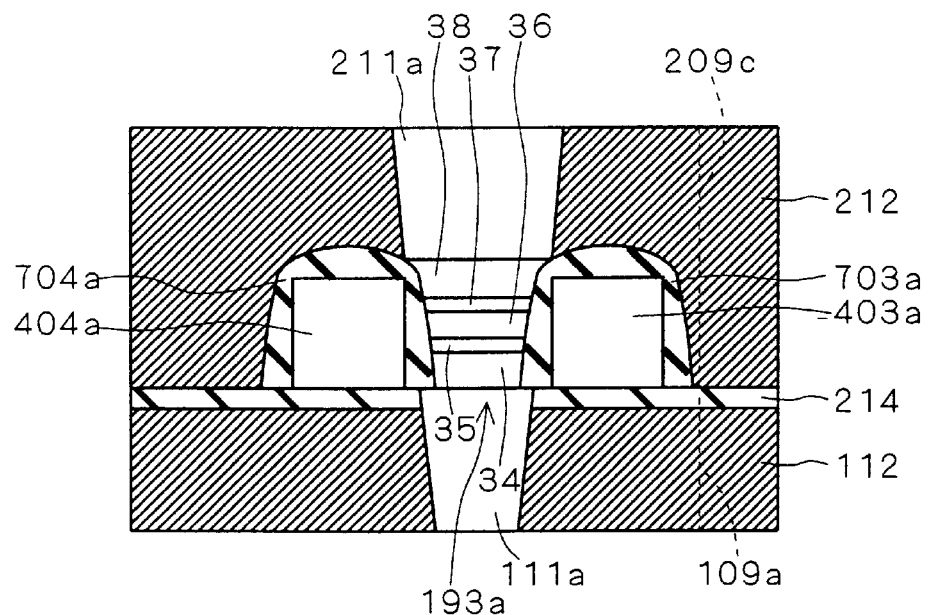
FIGS. 41 and 42 are cross-sectional views showing modifications of the memory cell according to the sixth preferred embodiment of the present invention.
Figure 42:
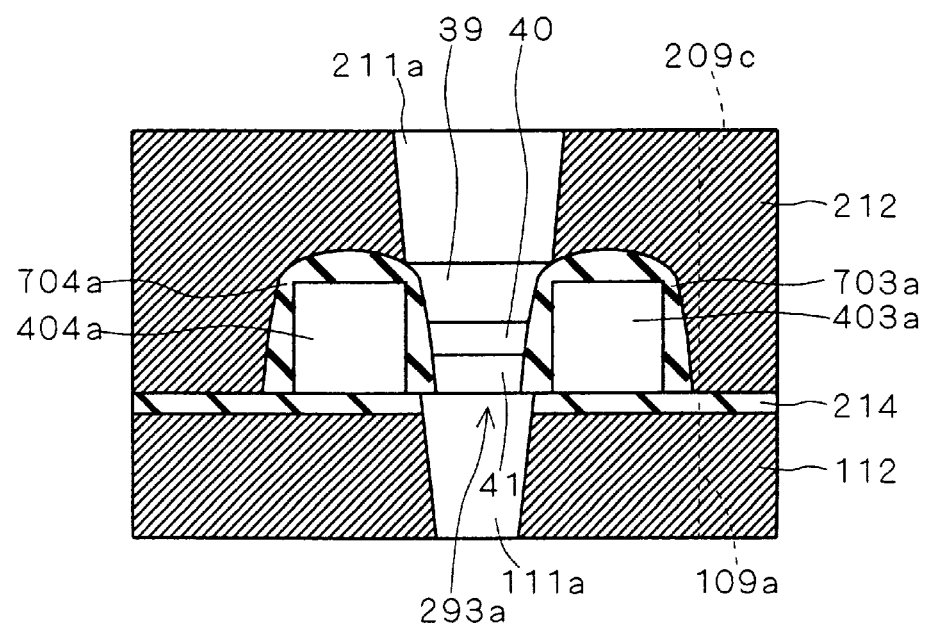

FIGS. 41 and 42 are enlarged cross-sectional views of a region T shown in FIG. 30. The structure of FIG. 41 is such that the transistor 93a is replaced with a transistor 193a having an LDD structure, and the structure of FIG. 42 is such that the transistor 93a is replaced with a transistor 293a having a buried channel.

Referring to FIG. 41, the transistor 193a comprises a multilayer structure including the n$^+$type source/drain region 34, the n$^-$type source/drain region 35, the p type channel region 36, the n$^-$type source/drain region 37, and the n$^+$type source/drain region 38 which are arranged in the order named as viewed from the silicon nitride film 214. The use of the transistor 193a having the LDD structure alleviates the electric field in the vicinity of the np junction to suppress the generation of hot carriers, as compared with the transistor 93a. Therefore, the structure shown in FIG. 41 increases the refresh pause time to suppress power consumption and enhance the efficiency with which the information stored in the memory is used.

Figure 45:
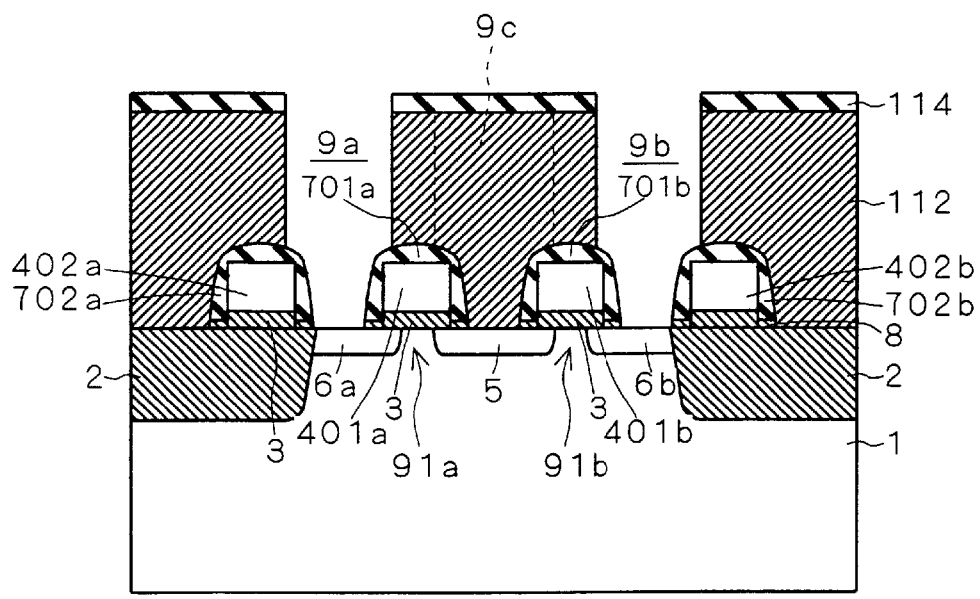
FIGS. 45 through 49 are cross-sectional views showing a method of manufacturing the memory cells in a step-by-step manner according to the seventh preferred embodiment of the present invention.

Referring to FIG. 42, the transistor 293a comprises a multilayer structure including the n$^+$type source/drain region 39, the n$^-$type channel region 40, and the n$^-$type source/drain region 41 which are arranged in the order named as viewed from the silicon structure, and a silicon nitride film is deposited on the silicon oxide film. A patterned photoresist is formed on the silicon nitride film. Using the patterned photoresist as a mask, reactive ion etching is performed to form the trench 9a between the insulation films 701a and 702a, the trench 9b between the insulation films 701b and 702b and a trench 9c between the insulation films 701a and 701b, exposing the source/drain regions 5 and 6, with the interlayer insulation film 112 and the insulation film 114 left. This provides the structure shown in FIG. 45. The trench 9c is shown as not appearing in the plane of the cross section of FIG. 45, and is indicated by the broken lines of FIG. 45.

Figure 46:
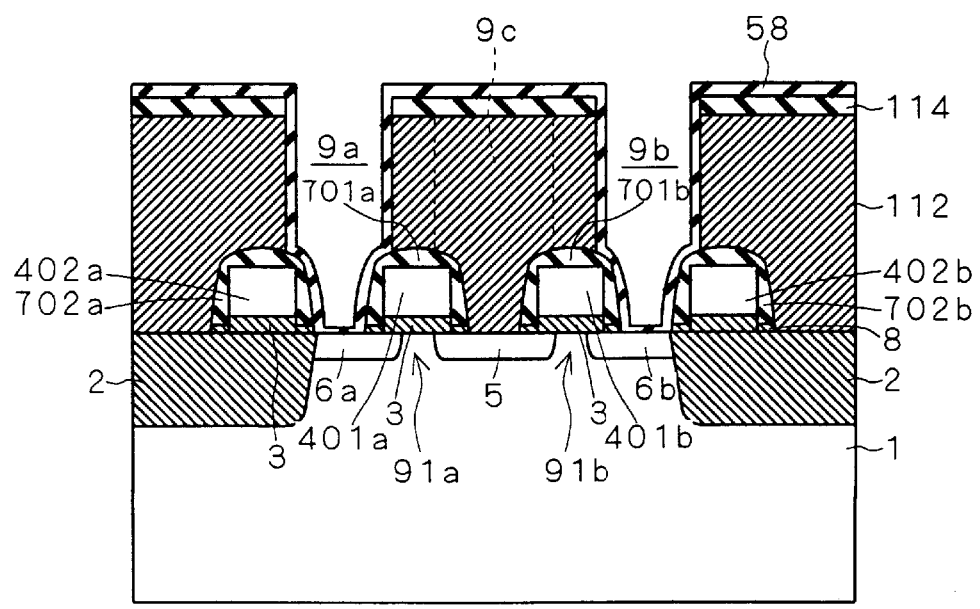

Next, a silicon film is deposited temporarily along the inner walls of the trenches 9a, 9b, 9c, and is then subjected to oxynitridation to form a silicon oxynitride film 58. The temporarily formed silicon film may be made of amorphous silicon or polysilicon. The gate electrodes 401, 402 covered with the insulation film 114 made of silicon nitride are hardly oxidized, but only the silicon film deposited on the inner walls of the trenches 9a, 9b, 9c are oxynitrided. This provides the structure shown in FIG. 46.

The oxynitriding conditions in this step may be selected from among NO oxidation, NO/O$_2$ oxidation and N$_2$O oxidation. A silicon oxide film may be formed in place of the silicon oxynitride film 58, in which case the oxidizing conditions may be selected from among wet oxidation, dry oxidation and pyrogenic oxidation.

Next, the silicon oxynitride film 58 on the bottom of the trenches 9a, 9b, 9c are anisotropically etched away until the source/drain regions 5, 6 are exposed. Then, doped amorphous silicon 59 containing high-concentration phosphorus is deposited by the CVD process to fill the trenches 9a, 9b, 9c. In the CVD process, the flow rate of the PH$_3$ gas as well as the SiH$_4$ gas is controlled to form n$^+$type source/drain regions 62, 64 and an n$^-$type channel region 63, thereby forming a vertical type transistor 95. The silicon oxynitride film 58 as well as the insulation films 701, 702 serves as part of the gate nitride film 214. The transistor 293a can have a lower threshold voltage than the transistor 93a to perform the write/read operation at a higher speed.

The first to third manufacturing methods may be basically employed to manufacture the transistors 193a and 293a, in which case the dopant type and the concentration settings should be controlled.

(c-3) Seventh Preferred Embodiment

The pads 10a, 10b in the structure shown in FIG. 14 may be replaced with vertical type transistors, respectively. A seventh preferred embodiment of the present invention provides the technique of such replacement and the technique of solving problems with a vertical type transistor which operates using the insulation films 701 and 702, when made of silicon nitride, as a gate insulation film. The latter technique may be applied to the fifth and sixth preferred embodiments.

Figure 43:
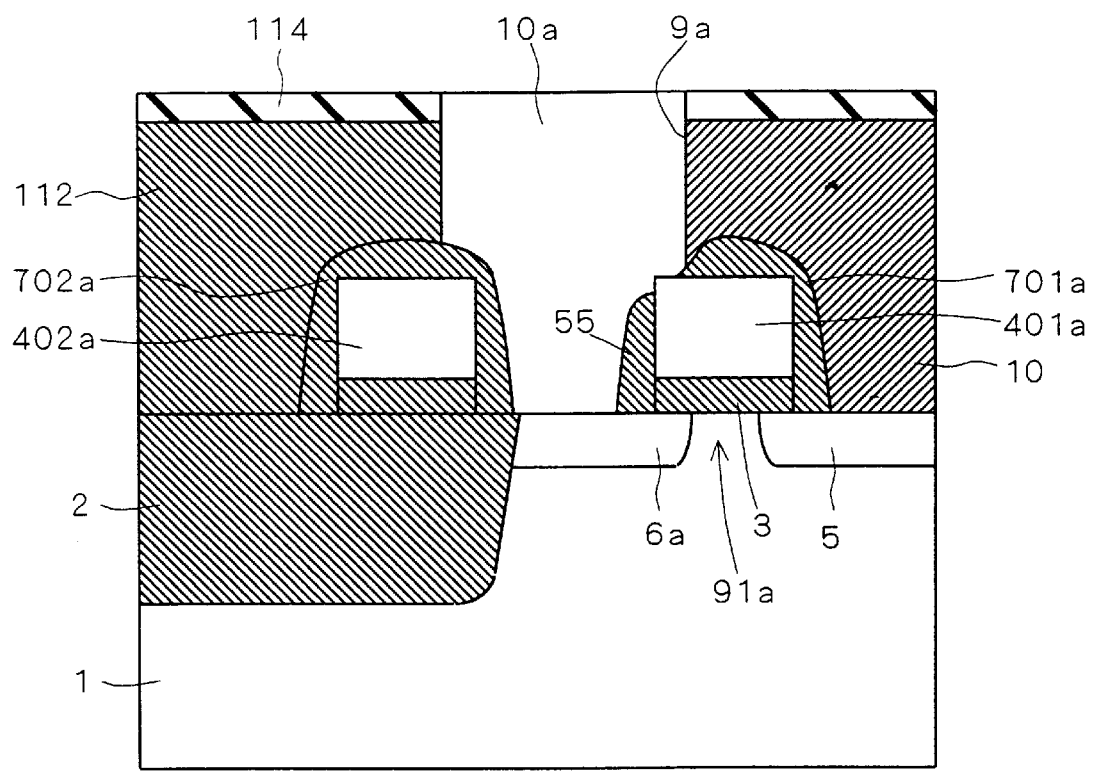
FIGS. 43 and 44 are cross-sectional views showing the background of a seventh preferred embodiment of the present invention.

As described above in the first preferred embodiment, it is desirable that the insulation films 701 and 702 are made of silicon nitride. FIG. 43 is a cross-sectional view of part of the structure shown in FIG. 14 which surrounds the source/drain region 6a when the insulation films 701a and 702a are made of silicon oxide. Since the insulation films 701a and 702a are made of silicon oxide although the insulation film 8 is not provided, the density of states at the interface between the insulation films 701a, 702a and the semiconductor substrate 1 (including the source/drain region 6a ) is low.

Since the selectivity ratio of the insulation films 701a, 702a to the interlayer insulation film 112 is approximately "1," there is a likelihood that the insulation films 701a, 702a are partially removed when the trench 9a is formed in the interlayer insulation film 112 by anisotropic etching. If such partial removal occurs, the pad 10a formed thereafter by filling the trench 9a with doped silicon is short-circuited to the gate insulation film of the vertical type transistor 95. Thereafter, the CMP process is performed using the insulation film 114 as a stopper to planarize the top surface of the doped amorphous silicon 59 above the insulation film 114. This provides the structure shown in FIG. 47.

Figure 47:
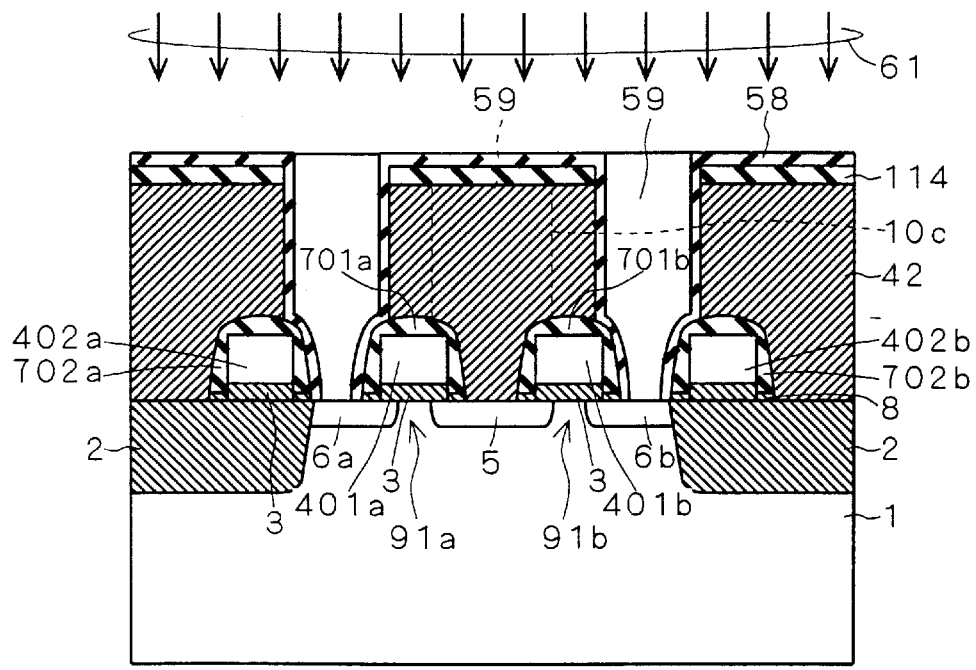

Thereafter, it is more preferable to implant nitrogen ions 61 into the doped amorphous silicon 59 (FIG. 47). The implanted nitrogen is thermally diffused by the subsequent heat treatment so that the dangling bonds (unsaturated bonds) of silicon atoms present near the interface between the silicon oxynitride film 58 and the doped amorphous silicon 59 are terminated with nitrogen atoms. Therefore, the implantation of the nitrogen ions 61 is effective in reducing the interface state density.

Next, heat treatment, e.g., at 550° C. crystallizes the doped amorphous silicon 59, with the semiconductor substrate 1 serving as a seed crystal, to form a virtually grain-boundary-free silicon crystal. Thereafter, sintering using hydrogen (hydrogen sintering) is preferably performed. The hydrogen sintering is more effective in terminating the dangling bonds of silicon atoms present near the interface between the silicon oxynitride film 58 and the doped amorphous silicon 59 with hydrogen atoms, thereby reducing the interface state density.

Figure 48:
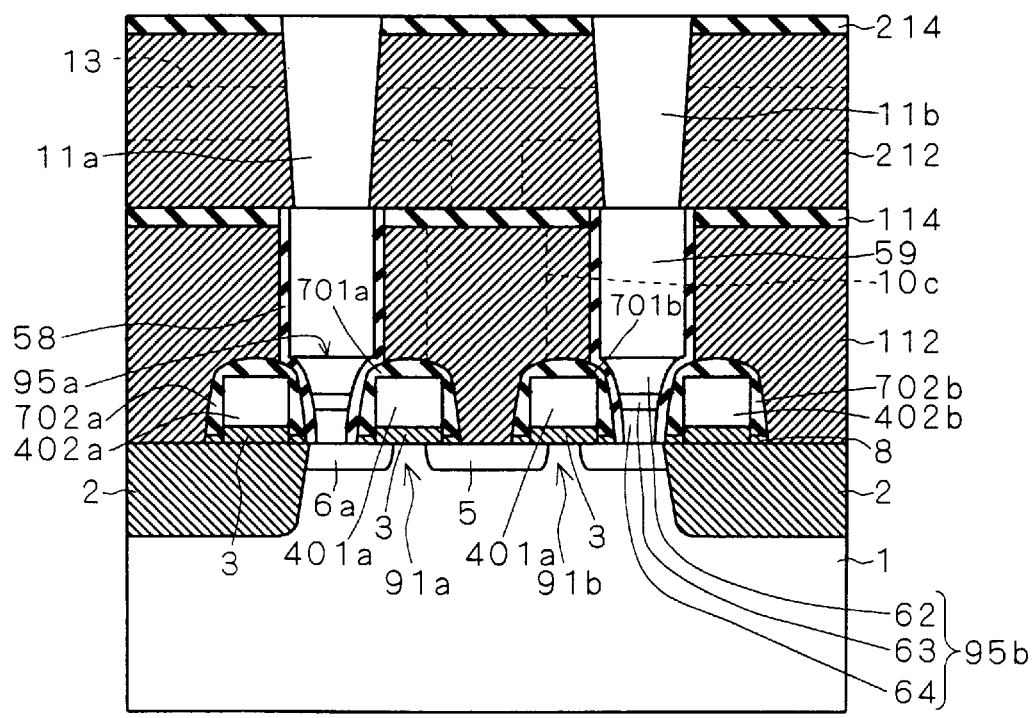
Figure 49:
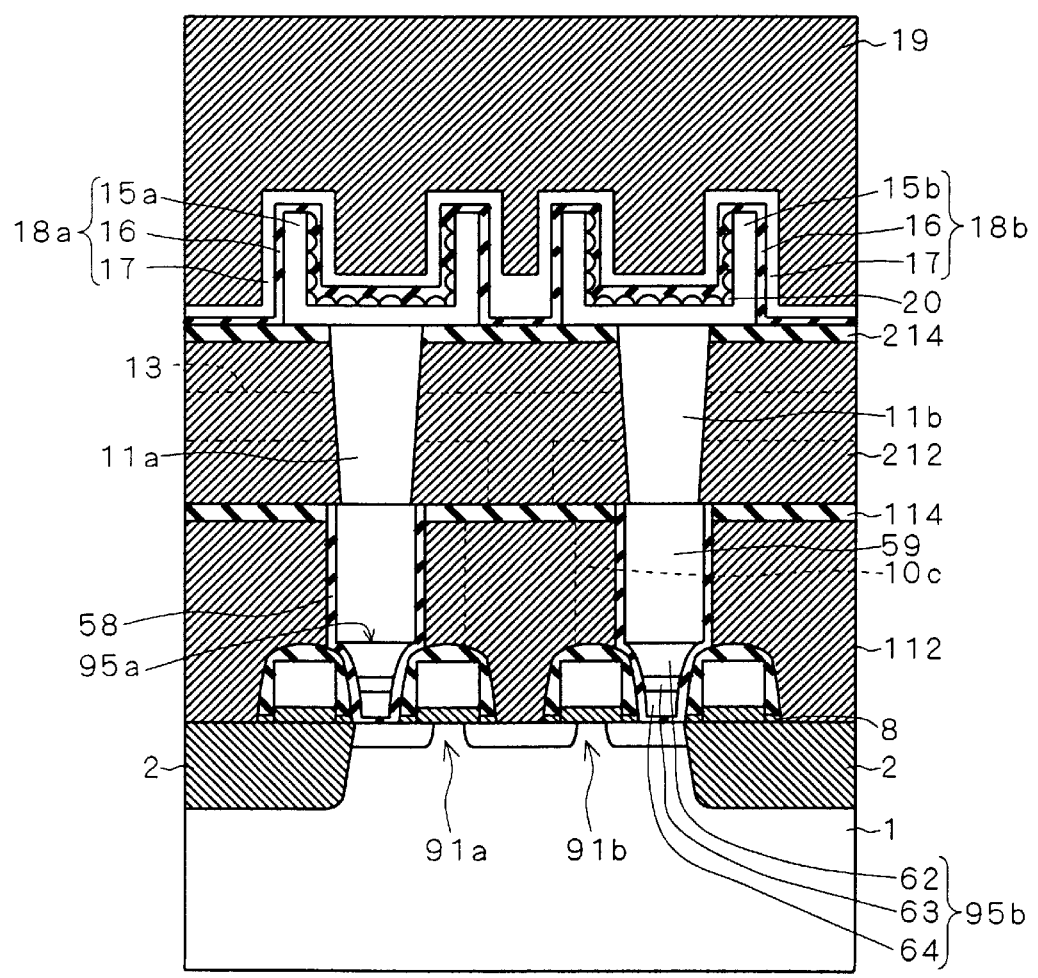

The interlayer insulation film 212, the insulation film 214 and the storage node 11 are formed in the same manner as in the fourth preferred embodiment to provide the structure shown in FIG. 48. The subsequent steps of forming the capacitor 18 and the interlayer insulation film 19 as described in the first preferred embodiment are performed to provide the memory cell structure shown in FIG. 49.

In the above described steps, the heat treatment such as RTA is, of course, performed to electrically activate phosphorus in amorphous silicon. This heat treatment may be performed in any one of the steps shown in FIGS. 45 through 49. electrodes 401a, 402a (although a short circuit between the pad 10a and the gate electrode 401a is shown in FIG. 43).

Figure 44:
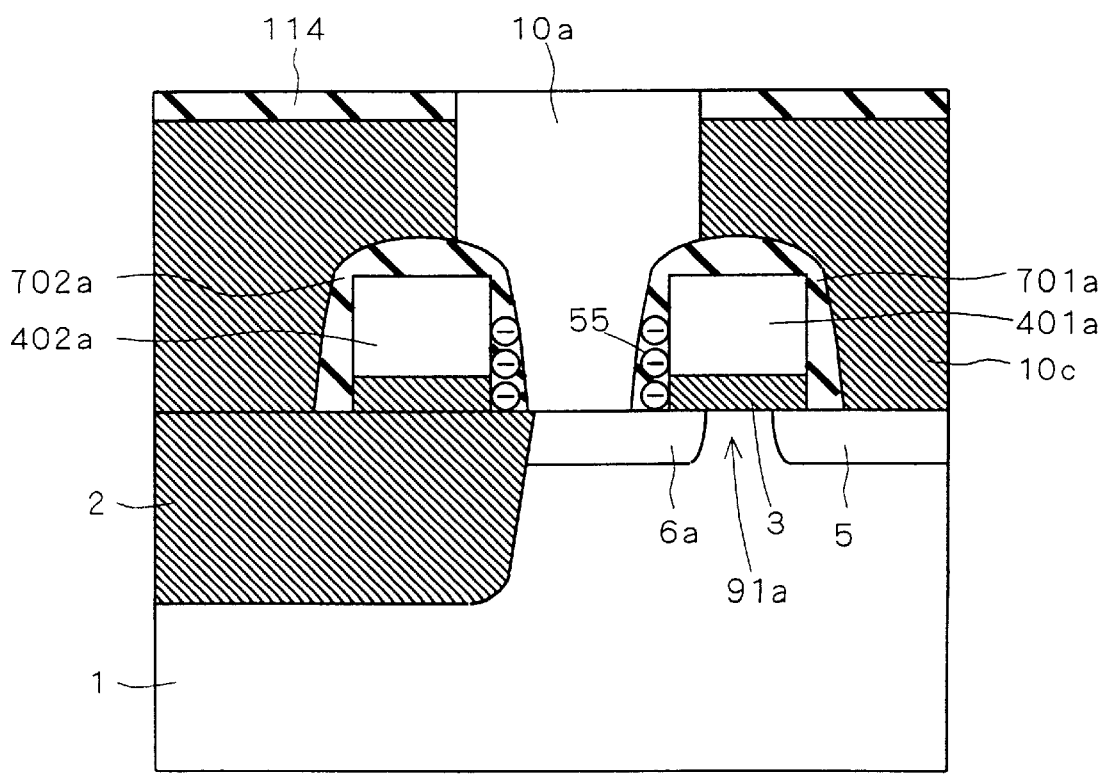

FIG. 44 is a cross-sectional view of part of the structure shown in FIG. 14 which surrounds the source/drain region 6a when the insulation film 701a is made of silicon nitride. In the absence of the insulation film 8 as shown in FIG. 44, the density of states at the interfaces between the insulation film 701a and the source/drain region 6a and between the insulation film 701a and the pad 10a increases to generate a trap 55 schematically shown in FIG. 44.

The increase in the interface state density not only decreases the resistance of the transistor 91 to hot carriers as described in the first preferred embodiment but also increases the tunneling current through the interface state or the leakage current resulting from variations in the threshold voltage of a vertical type transistor if the pad 10a is replaced with the vertical type transistor, shortening the refresh pause time. Additionally, the increase in the interface state density causes deterioration due to the refresh operation during the burn-in process to be hastened.

The seventh preferred embodiment provides memory cells which are free from the refresh deterioration during the burn-in process if the insulation films 701, 702 are made of silicon nitride and which include transistors in place of the pads 10a, 10b, and a method of manufacturing the same.

FIGS. 45 through 49 are cross-sectional views showing the method of manufacturing the memory cells in a step-by-step manner according to the seventh preferred embodiment of the present invention. Initially, the structure shown in FIG. 4 is produced in the steps described in the first preferred embodiment. The insulation films 701, 702 made of silicon nitride do not suffer the damage shown in FIG. 43. Thereafter, a silicon oxide film is formed using, e.g., TEOS on the entire surface of the resultant After the structure shown in FIG. 47 is produced, phosphorus ions may be additionally implanted to decrease the contact resistance between the storage node 11 and the bit line 13. After the structure shown in FIG. 48 is produced, phosphorus ions may be additionally implanted to decrease the contact resistance between the storage node 11 and the lower electrode 15.

The hydrogen sintering and the implantation of the nitrogen ions 61 need not always be carried out. Similar effects may be produced if the step of forming the silicon oxynitride film 58 is eliminated but the steps of performing the hydrogen sintering and implanting the nitrogen ions 61 are performed. Performing at least one of the steps of performing the hydrogen sintering, implanting the nitrogen ions 61 and forming the silicon oxynitride film 58 (or the silicon oxide film) produces the effect of reducing the interface state of the transistor 95.

The above described memory cell structures may be applied to a DRAM and a DRAM-incorporated system LSI circuit, to attain a semiconductor device which is low in power consumption and high in efficiency of use.

While the invention has been described in detail, the foregoing description is in all aspects illustrative and not restrictive. It is understood that numerous other modifications and variations can be devised without departing from the scope of the invention.

What is claimed is:

1. A memory cell comprising:
    a first transistor having a pair of source/drain regions provided in an upper surface of a semiconductor substrate, and a gate electrode opposed to said semiconductor substrate with a first insulation film therebetween;
    a capacitor opposed to said first transistor with an interlayer insulation film therebetween in a depth direction of said semiconductor substrate, said capacitor being connected to one of said source/drain regions of said first transistor; and
    a second transistor disposed in said interlayer insulation film between said one of said source/drain regions of said first transistor and said capacitor, said second transistor having a pair of source/drain regions stacked in the depth direction of said semiconductor substrate.

2. The memory cell according to claim 1,
    wherein said first transistor and said second transistor are of the same conductivity type; and
    wherein said gate electrode of said first transistor has a sidewall covered with a second insulation film, and said pair of source/drain regions of said second transistor are disposed adjacent to said gate electrode of said first transistor with said second insulation film therebetween.

3. The memory cell according to claim 2,
    wherein a surface of said second insulation film in contact with said pair of source/drain regions of said second transistor is doped with oxygen.

4. The memory cell according to claim 1,
   wherein said second transistor further has a gate electrode provided over said first transistor, and a second insulation film for covering a sidewall of said gate electrode of said second transistor; and
   wherein said pair of source/drain regions of said second transistor are disposed adjacent to said gate electrode of said second transistor with said second insulation film therebetween.

5. The memory cell according to claim 1, further comprising
   a semiconductor layer for establishing a connection between one of said source/drain regions of said second transistor and said capacitor,
   wherein said second transistor further has a second insulation film disposed adjacent to said pair of source/drain regions of said second transistor, and
   wherein a surface of said semiconductor layer in contact with said second insulation film is doped with at least one of nitrogen and hydrogen.

* * * * *